US009252356B2

(12) United States Patent
Kimura et al.

(10) Patent No.: US 9,252,356 B2
(45) Date of Patent: Feb. 2, 2016

(54) MAGNETIZATION REVERSAL DEVICE, MEMORY ELEMENT, AND MAGNETIC FIELD GENERATION DEVICE

(75) Inventors: Takashi Kimura, Fukuoka (JP); Kohei Hamaya, Fukuoka (JP)

(73) Assignee: Kyushu University, National University Corporation, Fukuoka (JP)

( * ) Notice: Subject to any disclaimer, the term of this patent is extended or adjusted under 35 U.S.C. 154(b) by 678 days.

(21) Appl. No.: 13/382,801

(22) PCT Filed: Jul. 9, 2010

(86) PCT No.: PCT/JP2010/061693
§ 371 (c)(1),
(2), (4) Date: Feb. 16, 2012

(87) PCT Pub. No.: WO2011/004891
PCT Pub. Date: Jan. 13, 2011

(65) Prior Publication Data
US 2012/0133007 A1   May 31, 2012

(30) Foreign Application Priority Data
Jul. 9, 2009   (JP) .................................. 2009-162768

(51) Int. Cl.
*G11C 11/00* (2006.01)
*H01L 43/08* (2006.01)
(Continued)

(52) U.S. Cl.
CPC ................ *H01L 43/08* (2013.01); *G11C 11/16* (2013.01); *H01L 27/22* (2013.01)

(58) Field of Classification Search
CPC ......... G11C 11/16; H01L 43/08; H01L 27/22
USPC .................. 365/158, 171, 173, 157
See application file for complete search history.

(56) References Cited

U.S. PATENT DOCUMENTS 7,022,532 B1 *   4/2006   Vashchenko et al. ............. 438/3
2005/0190594 A1 *   9/2005   Nakamura et al. ............ 365/171
(Continued)

FOREIGN PATENT DOCUMENTS

JP   2005-19561   1/2005
JP   2008-171945   7/2008
(Continued)

OTHER PUBLICATIONS

Kubota et al., "Toward Realization of High-Density Spin-Torque MRAM", 231-235 (2009).
(Continued)

*Primary Examiner* — Tha-O H Bui
(74) *Attorney, Agent, or Firm* — Fay Sharpe LLP

(57) ABSTRACT

A magnetization reversal device includes a ferromagnetic 12 body which is provided in an interconnection of a non-ferromagnetic dot 11 so that a part or a whole of the ferromagnetic dot is three-dimensionally buried in the interconnection of said non-ferromagnetic dot, and a spin injection source 13 which generates a spin-polarized pure spin current without a flow of charges, and which is provided in the interconnection of the non-ferromagnetic dot 11 to be in contact therewith so that the interconnection of the non-ferromagnetic dot serves as a common electrode, and the pure spin current flows into the ferromagnetic dot 2 through the interconnection of the non-magnetic body by the spin injection source 13 due to a diffusion current, to thereby reverse magnetization of the ferromagnetic dot 12. By injecting the pure spin current, using this planar structure, it is possible to easily carry out the magnetization reversal of the ferromagnetic dot 12 even if it is a thick film ferromagnetic dot without being subjected to limitation of a spin diffusion length.

14 Claims, 15 Drawing Sheets

(51) Int. Cl.
*G11C 11/16* (2006.01)
*H01L 27/22* (2006.01)

(56) References Cited

U.S. PATENT DOCUMENTS

| | | | |
|---|---|---|---|
| 2006/0022220 A1* | 2/2006 | Inomata | B82Y 10/00 257/214 |
| 2007/0064342 A1* | 3/2007 | Nakamura | B82Y 25/00 360/119.02 |

FOREIGN PATENT DOCUMENTS

| | | |
|---|---|---|
| JP | 2009-037702 | 2/2009 |
| WO | WO 2008/123023 | 10/2008 |

OTHER PUBLICATIONS

Chappert et al., "The Emergence of Spin Electronics in Data Storage", Nature Materials 6, 813-823 (2007).
Hiramoto, "What is Beyond CMOS?", Applied Physics 77, 253 (2008).
Yuasa and Djayaprawira, "Coherent Spin-Dependent Tunneling and Giant TMR Effect in Magnetic Tunnel Junctions with a Crystalline MgO Tunnel Barrier", Journal of the Physics Society of Japan, vol. 62, No. 3, 156-163 (2007).
Miyazaki, "History and Prospect of TRM Effect", Magnetics Jpn., vol. 3, No. 5, 212-218 (2008).
Nakamura, "Progress of Spin-Transfer-Related Phenomena in Magnetic Junctions", Magnetics Jpn., vol. 3, No. 5, 219-227 (2008).
Kimura et al., "Spin Transport in Lateral Ferromagnetic/Nonmagnetic Hybrid Structure", J. Phys.: Condens. Matter 19 (2007) 165216 (13pp).
Kimura et al., "Estimation of Spin-Diffusion Length From the Magnitude of Spin-Current Absorption: Multiterminal Ferromagnetic/Nonferromagnetic Hybrid Structures", Phys. Rev. B72,14461 (2005).
Kimura et al., "Switching Magnetization of Nanoscale Ferromagnetic Particle Using Nonlocal Spin Injection", Phys. Rev. Lett. 96, 37201 (2006).
Kimura et al., "Electrical Control of the Direction of Spin Accumulation", Physical Review Letters, 99, 166601 (2007).
International Search Report of International Application No. PCT/JP2010/061693 dated Oct. 12, 2010.
Supplementary European Search Report of European Application No. 10797202.8 Dated Mar. 22, 2013, 6 pages.
Pierre Seneor et al.: "Nanospintronics: when spintronics meets single electron physics", Journal of Physics: Condensed Matter, Institute of Physics Publishing, Bristol, GB, vol. 19, No. 16, Apr. 23, 2007; pp. 1-22.
Yuan R Y et al.: "Spin-polarized transport in a coupled-double-quantum-dot system with ferromagnetic electrodes", Journal of Physics: Condensed Matter, Institute of Physics Publishing, Bristol, GB, vol. 19, No. 37, Sep. 19, 2007; pp. 1-10.
Seneor et al., "Nanospintronics: When Spintronics Meets Single Electron Physics", Journal of Physics: Condensed Matter, Institute of Physics Publishing, vol. 19, No. 16, Apr. 23, 2007, pp. 1-22.
Yuan et al., "Spin-polarized Transport in a Coupled-double-quantum-dot System With Ferromagnetic Electrodes", Journal of Physics: Condensed Matter, Institute of Physics Publishing, vol. 19, No. 37, Sep. 19, 2007, pp. 1-10.
Supplementary European Search Report of European Application No. EP 10 79 7202 dated Mar. 3, 2013.

* cited by examiner (A)

(B)

(A)

(B)

(A)

......▶ Pure Spin Current

‐ ‐ ‐ ‐▶ Charge Current (B)

(A)

(B)

(A)  (B)

(A)

(B)

(C)

PRIOR ART

PRIOR ART (A)  (B)

PRIOR ART

MAGNETIZATION REVERSAL DEVICE, MEMORY ELEMENT, AND MAGNETIC FIELD GENERATION DEVICE

TECHNICAL FIELD

The present invention relates to a magnetization reversal technique based on a spin injection.

BACKGROUND OF ART

In late years, although miniaturization of CMOS transistors advance, it is concerned about the miniaturization being near to the limit. Therefore, before the limit of the miniaturization of the CMOS transistors can be defeated, it is necessary to develop a new feature element based on a different operation principle.

A magnetoresistive RAM (MRAM) having a magneto tunnel junction (MTJ) as a basic structure (see: Non-Patent Documents 1 and 2) is a high performance energy-saving element utilizing a non-volatility of a ferromagnetic dot, and research and development for a practical use are carried out as one of major candidates of next-generation electronic devices (see: Non-Patent Document 3).

A magneto tunnel junction (MTJ) element, which is an important component of the MRAM, realizes a large magnetoresistance variation (TMR ratio) of several hundred percentages at room temperature due to quality improvement of MgO tunnel barrier and development of a high spin polarization material (see: Non-Patent Documents 4 and 5). Therefore, a reading technique, which is one of the basic operations of the MRAM, is meeting necessary performance. On the other hand, at present, as a writing technique, there is a magnetization reversal method (a spin torque method) based on a spin polarization current (see: Non-Patent Document 6).

Nevertheless, as shown in FIG. 13, a spin injection method using a present layered structure, in which an injection of spins is only one-dimensionally carried out, is theoretically applicable to only a very thin film electrode of a ferromagnetic layer having a thickness less than a spin diffusion length (on the order of several nm). Therefore, an accumulation magnetic energy decreases with miniaturization of an element size (=improvement of an integration degree), and spin in stability due to thermal fluctuation becomes a large problem. In addition, a Joule heat is generated due to a flow of charges raiding on a spin current. For this reason, a limitation, in which a material featuring a small saturation magnetization and a small friction efficiency must be used for an electrode, and which is different from optimization of spin conductivity in the MTJ, occurs, resulting in decline in a reduction of the magnetoresistance charge which is needed in a reading.

In not only the MRAM but also all high function spin devices, it is strongly desired that both improvement of spin thermal disturbance durability and low power consumption in a writing operation can be realized without incompatibility while maintaining high element performance (spin device performance).

The inventors have taken notice of a planar structure featuring high flexibility as an element structure, and have carried out researches on a method of generating a spin current without a flow of charges (which is defined as a pure spin current), and a method of controlling the spin current ((see: for example, Non-Patent Document 7).

FIG. 14 is a view showing a pure spin current. In the upper section of FIG. 14, spin-polarized electric currents are defined as usual electric current on which spin currents are ridden, flows of charges corresponding to a number of electrons (three electrons (e) in FIG. 14 occur, and spin currents including a ↑spin (two in FIG. 14) and a ↓spin (one in FIG. 14) flow in the same direction so that a compensated spin current is generated. On the other hand, in the lower section of FIG. 14, pure spin currents including a ↑spin electron (one in FIG. 14) and a ↓spin electron (one in FIG. 14) flow in the reverse directions to each other due to a diffusion current so that flows of charges are compensated with each other (zero), to thereby cause flows of electrons carrying only spin angular momentum. Since these pure spin currents are conducted due to diffusion from a nonequilibrium state to an equilibrium state, a concept of the generation and control on the pure spin currents is different from that of the flows of charges conducted in an electric field. The inventors have found a spin absorption effect by which the pure spin currents efficiently flow into a ferromagnetic dot featuring a strong spin relaxation (see: Non-Patent Document 8).

Also, the inventors have developed an element structure as shown in FIG. 15 (FIG. 15(A) is an SEM image, and FIG. 15(B) is a concept view thereof), and have proved that it is possible to carry out a magnetization reversal of a fine ferromagnetic dot of permalloy by injecting only the pure spin currents into the fine ferromagnetic dot of permalloy without any electric currents being made to directly flow thereinto (see: Non-Patent Document 9).

Further, the inventors have developed a control method of electrically rotating an accumulation spin vector by carrying out spin injections, using plural terminals (see: Non-Patent Document 10).

PRIOR ART DOCUMENTS

Non-Patent Documents

Non-Patent Document 1: Hitoshi KUBOTA, Yoshishige SUZUKI, Shinji YUASA, "Toward Realization of High-Density Spin-Torque MRAM"

Non-Patent Document 2: Claude chappert, Albert Fert & Frederic Nguyen Van Dau, "The Emergence of Spin Electronics in Data Storage", Nature Materials 6, 813-823, 2007

Non-Patent Document 3: Toshirou HIRAMOTO, "What is Beyond CMOS?", Applied Physics 77, 253, 2008

Non-Patent Document 4: Shinji YUASA, David D. Djayaprawira, "Coherent Spin-Dependent Tunneling and Giant TMR Effect in Magnetic Tunnel Junctions with a Crystalline MgO Tunnel Barrier", Journal of the Physics Society of Japan Non-Patent Document 5: Terunobu MIYAZAKI, "History and Prospect of TRM effect", MAGNE 3, 212-218, 2008

Non-Patent Document 6: Shiho NAKAMURA, "Progress of Spin-Transfer-Related Phenomena in Magnetic Junctions", MAGNE 3, 219-227, 2008

Non-Patent Document 7: T. Kimura and Y. Otani, "Spin Transport in Lateral Ferromagnetic/Nonmagnetic Hybrid Structure", J. Phys. Cond. Mat. 19, 165216, 2007

Non-Patent Document 8: T. Kimura, J. Hamrle and Y. Otani, "Estimation of Spin-diffusion Length from the Magnitude of Spin Current Absorption: Multi-Terminal Ferromagnetic/Nonmagnetic hybrid Structures", Phys. Rev. B72, 14461, 2005

Non-Patent Document 9: T. Kimura, J. Hamrle, "Switching Magnetization of Nanoscale Ferromagnetic Particle Using Nonlocal Spin Injection", Phys. Rev. Lett. 96, 37201, 2006

Non-Patent Document 10: T. Kimura, Y. Otani, and Peter M. Levy, "Electrical Control of the Direction of Spin Accumulation", Physical Review Letters, 99, 166601, 2007

SUMMARY OF THE INVENTION

Problems to be Resolved by the Invention

Nevertheless, none of the disclosed techniques could apply to magnetization reversal of a ferromagnetic dot (free layer) having a thickness of more than a spin diffusion length, and thus a problem concerning the spin thermal disturbance durability and a problem concerning the decline in the reduction of the magnetoresistance charge could not be resolved.

Thus, an object of the present invention is to provide a magnetization reversal technique in which pure spin currents including no electric charge can be generated from single terminal or multi terminals, using a planar structure which is not a layered structure, in which a ferromagnetic dot is buried in a non-ferromagnetic dot so that the pure spin currents can be injected into the ferromagnetic dot in plural directions, and in which it is possible to reverse the magnetization of the ferromagnetic dot without being subjected to limitation of a spin diffusion length.

Means for Solving the Problems

A magnetization reversal device as disclosed in the present application comprises a ferromagnetic dot provided in an interconnection of a non-ferromagnetic dot so that a part or a whole of the ferromagnetic dot is three-dimensionally buried in the interconnection of the non-ferromagnetic dot, and a spin injection means that generates a spin-polarized pure spin current without a flow of charges, and that is provided in the interconnection of the non-ferromagnetic dot to be in contact therewith so that the interconnection of the non-ferromagnetic dot serves as a common electrode, and is characterized by the fact that the pure spin current flows into the ferromagnetic dot through the intermediary of the interconnection of the non-magnetic body due to a diffusion current by the spin injection means, to thereby reverse magnetization of the ferromagnetic dot.

As stated above, since the part or the whole of the ferromagnetic dot is three-dimensionally buried in the interconnection of the non-ferromagnetic dot, a junction area between the ferromagnetic dot and the non-ferromagnetic dot is increased so that a large quantity of pure spin currents can be absorbed by the ferromagnetic dot due to a diffusion current from the spin injection means, and thus it is possible to obtain a technical advantage that the ferromagnetic dot can be easily reversed even if a thickness of the ferromagnetic dot is thicker than the spin diffusion length. Also, due to the fact that the magnetization reversal of the thick ferromagnetic dot is made possible, it is possible to obtain another technical advantage that it can be prevented that the spins become unstable by thermal disturbance. Further, since there is no generation of Joule's heat by the charge current, there is no regularation in the electrode thickness and the material for the ferromagnetic electrode, resulting in maintaining the large magnetoresistance effect.

The magnetization reversal device as disclosed in the present application is characterized by the fact that the device further comprises multi-terminal spin injection means, and that one of the spin injection terminal means is located at an position except for a current path for a corresponding pure spin current between another spin injection means of the multi-terminal spin injection means and the ferromagnetic dot.

As stated above, since a large quantity of pure spin currents flow into the ferromagnetic dot due to diffusion of the electrons from the multi-terminal spin injection means, it is possible to obtain a technical advantage that the ferromagnetic dot can be easily reversed even if it is a thick film ferromagnetic dot.

The magnetization reversal device as disclosed in the present application comprises a ferromagnetic dot provided on an interconnection of a non-ferromagnetic dot so as to be two-dimensional contact therewith, and multi-terminal spin injection means that generate spin-polarized pure spin currents without flows of charges, and that are provided in the interconnection of the non-ferromagnetic dot to be in contact therewith so that the interconnection of the non-ferromagnetic dot serves as a common electrode, and is characterized by the fact that one of the multi-terminal spin injection means is located at an position except for a current path for a corresponding pure spin current between another spin injection means of the multi-terminal spin injection means and the ferromagnetic dot, and that each of the pure spin currents flows into the ferromagnetic dot through the intermediary of the interconnection of the non-magnetic body due to a diffusion current by the corresponding spin injection means, to thereby reverse magnetization of the ferromagnetic dot.

As stated above, since a large quantity of pure spin currents flow into the ferromagnetic dot due to diffusion currents from the multi-terminal spin injection means, it is possible to obtain a technical advantage that the ferromagnetic dot can be reversed even if it is a thick film ferromagnetic dot. Also, due to the fact that the magnetization reversal of the thick film ferromagnetic dot is made possible, it is possible to obtain another technical advantage that it can be prevented that the spins become unstable by thermal disturbance. Further, since there is no generation of Joule's heat by the charge current, it is possible to obtain yet another technical advantage that an electrical material for an electrode is subjected to no limitation, and that it is possible to prevent decline in a variation of the magnetic resistance.

The magnetization reversal device as disclosed in the present application is characterized by the fact that a relationship between a first injection direction in which a corresponding pure spin current is injected by a first spin injection means and a second injection direction in which a corresponding pure spin current is injected by a second spin injection means is one except for either a parallel relationship or an antiparallel relationship; and that a ratio of a quantity of the pure spin currents injected by the first spin injection means and the second spin injection means is adjusted in synchronization with a precession of the spins in the ferromagnetic dot so that a pure spin current featured by a vector having an optional direction in a two-dimensional plane is generated to a vector of the spins subjected to the precession in the ferromagnetic dot, whereby a torque acting on the spins is optimized.

As stated above, since the ratio of the quantity of the pure spin currents injected by the first spin injection means and the second spin injection means is adjusted in synchronization with the precession of the spins in the ferromagnetic dot, and since the pure spin current featured by the vector having the direction, in which the torque acting on the vector of the spins subjected to the precession in the ferromagnetic dot is always optimized, is generated by controlling the directions of the spins, the torque acting on the spins can be optimized in synchronization with the precession of the spins in the ferromagnetic dot. Thus, it is possible to obtain a technical advantage that the magnetization can be speedily reversed with a small electric power. Also, by adjusting the ration of the quantity of the injected pure spin currents, it is possible to electrically control the direction of the vector of the generated pure spin currents.

The magnetization reversal device as disclosed in the present application is characterized by the fact that the device further comprises a third injection means for injecting a pure spin current, that a relationship between a third injection direction in which a corresponding pure spin current is injected by the third spin injection means, the first injection direction and/or the second injection direction is one except for either a parallel relationship or an antiparallel relationship, and that a ratio of a quantity of the pure spin currents injected by the first spin injection means, the second spin injection means and the third spin injection means is adjusted in synchronization with a precession of the spins in the ferromagnetic dot so that a pure spin current featured by a vector having an optional direction is generated to a vector the spins subjected to the precession in the ferromagnetic dot, whereby a torque acting on the spins is optimized.

As stated above, since the ratio of the quantity of the pure spin currents injected by the first spin injection means, the second spin injection means and the third spin injection means is adjusted in synchronization with a precession of the spins in the ferromagnetic dot, and since the pure spin current featured by the vector having the direction, in which the torque acting on the vector of the spins subjected to the precession in the ferromagnetic dot is always optimized, is generated by controlling the directions of the spins, the torque acting on the spins can be optimized with respect to the three-dimensional precession of the spins. Thus, it is possible to obtain a technical advantage that the magnetization can be speedily reversed with a smaller electric power. Also, by adjusting the ration of the quantity of the injected pure spin currents, it is possible to electrically control the direction of the vector of the generated pure spin currents.

The magnetization reversal device as disclosed in the present application is characterized by the fact that the device further comprises an electric current source that supplies the spin injection means and the non-ferromagnetic dot with electric currents, and that a closed circuit is at least formed by the spin injection means, the non-ferromagnetic dot and the electric current source, wherein the diffusion current is generated by energizing the closed circuit with the electric currents, to thereby generate the pure spin currents.

As stated above, since the closed circuit is at least formed by the spin injection means, the non-ferromagnetic dot and the electric current source, and since the diffusion current is generated by energizing the closed circuit with the electric currents, to thereby generate the pure spin currents, it is possible to obtain a technical advantages that the pure spin current without the flow of charges can be generated due to the diffusion current by the simple circuit structure.

A memory element as disclosed in the present application is characterized by the fact that an interconnection of a conductor body includes an interconnection of a non-ferromagnetic dot which is configured so that horizontal lines and vertical lines are perpendicularly intersected with each other to thereby produce points of intersection, a ferromagnetic dot being provided at any one of the points of intersection so that at least one part of the ferromagnetic dot is in contact with the interconnection of the non-ferromagnetic dot, one or multi-terminal spin injection means, each of which generates a spin-polarized pure spin current without a flow of charges, being provided at another one or other ones of the points of intersection which is adjacent to the aforesaid one point of intersection at which the ferromagnetic dot is provided, each of the multi-terminal spin injection means being in contact with the interconnection of the non-ferromagnetic dot so that the interconnection of the non-ferromagnetic dot serves as a common electrode; and that the pure spin current flows into the ferromagnetic dot through the intermediary of the interconnection of the non-magnetic body by each of the spin injection means due to a diffusion current, to thereby reverse magnetization of the ferromagnetic dot so that a bit is written therein.

As stated above, since the interconnection of the conductor body includes the interconnection of the non-ferromagnetic dot which is configured so that the horizontal lines and the vertical lines are perpendicularly intersected with each other to thereby produce points of intersection, since the ferromagnetic dot is provided at any one of the points of intersection, and since the one or multi-terminal spin injection means are provided at the one or others of the points of intersection which are adjacent to the aforesaid one of the points of intersection through the intermediary of the non-ferromagnetic dot, not only can a large quantity of pure spin currents be absorbed by the ferromagnetic dot, but also magnetization of a thick film ferromagnetic dot featuring spin thermal disturbance durability can be reversed with low power consumption, so that it is possible to securely and stably carry out a writing of a bit of information.

The memory element as disclosed in the present invention is characterized by the fact that the interconnection of the non-magnetic body included in the interconnection of the conductor body has not only the vertically and horizontally intersected portion but also a perpendicularly and diagonally intersected portion.

As stated above, the interconnection of the non-magnetic body included in the interconnection of the conductor body has not only the vertically and horizontally intersected portion but also the perpendicularly and diagonally intersected portion, a number of the spin injection means can be increased so that a further large quantity of pure spin currents can be absorbed by the ferromagnetic dot, whereby it is possible to reverse the magnetization of a further large ferromagnetic dot. Thus, it is possible to obtain a technical advantage that the memory element can be utilized as a next generation memory featuring a superior heat stability.

The memory element as disclosed in the present application is characterized by the fact that the ferromagnetic dot is provided so as to be three-dimensionally buried in the interconnection of the non-ferromagnetic dot.

As stated above, since the ferromagnetic dot is provided so as to be three-dimensionally buried in the interconnection of the non-ferromagnetic dot, the pure spin currents are absorbed in the plural directions, whereby it is possible to obtain a technical advantage that a writing of a bit of information can be stably carried out.

The memory element as disclosed in the present application is characterized by the fact that at least a first spin injection means and a second spin injection means are provided at other points of intersection in the interconnection of the non-magnetic body, a relationship between a first injection direction in which a pure spin current is injected by the first spin injection means and a second injection direction in which a pure spin current is injected by the second spin injection means being one except for either a parallel relationship or an antiparallel relationship; and that a ratio of a quantity of the pure spin currents injected by the first spin injection means and the second spin injection means is adjusted in synchronization with a precession of the spins in the ferromagnetic dot so that a pure spin current featured by a vector having an optional direction in a two-dimensional plane is generated to the spins subjected to the precession in the ferromagnetic dot, whereby a torque acting on the spins is optimized.

As stated above, since the ratio of the quantity of the pure spin currents injected by the first spin injection means and the second spin injection means is adjusted in synchronization with the precession of the spins in the ferromagnetic dot, and since the pure spin current featured by the vector having the direction, in which the torque acting on the vector of the spins subjected to the precession in the ferromagnetic dot is always optimized, is generated by controlling the directions of the spins, the torque acting on the spins can be optimized in synchronization with the precession of the spins in the ferromagnetic dot. Thus, it is possible to obtain a technical advantage that the magnetization can be speedily reversed with a small electric power. Also, by adjusting the ration of the quantity of the injected pure spin currents, it is possible to electrically control the direction of the vector of the generated pure spin currents.

The memory element as disclosed in the present application is characterized by the fact that the element further comprises a third injection means for injecting a pure spin current, which is provided at another point of intersection except for the points of intersection at which the first spin injection means and the second spin injection means are provided, that a relationship between a third injection direction in which a corresponding pure spin current is injected by the third spin injection means, the first injection direction and/or the second injection direction is one except for either a parallel relationship or an antiparallel relationship; and that a ratio of a quantity of the pure spin currents injected by the first spin injection means, the second spin injection means and the third spin injection means is adjusted in synchronization with a precession of the spins in the ferromagnetic dot so that a pure spin current having an optional direction is generated to the spins subjected the precession in the ferromagnetic dot, whereby a torque acting on the spins is optimized.

As stated above, since the ratio of the quantity of the pure spin currents injected by the first spin injection means, the second spin injection means and the third spin injection means is adjusted in synchronization with a precession of the spins in the ferromagnetic dot, and since the pure spin current featured by the vector having the direction, in which the torque acting on the vector of the spins subjected to the precession in the ferromagnetic dot is always optimized, is generated by controlling the directions of the spins, the torque acting on the spins can be optimized with respect to the three-dimensional precession of the spins. Thus, it is possible to obtain a technical advantage that the magnetization can be speedily reversed with a smaller electric power. Also, by adjusting the ration of the quantity of the injected pure spin currents, it is possible to electrically control the direction of the vector of the generated pure spin currents.

The memory element as disclosed in the present application is characterized by the fact that the element further comprises an electric current source that supplies the spin injection means and the non-ferromagnetic dot with electric currents; and that a closed circuit is at least formed by the spin injection means, the non-ferromagnetic dot and the electric current source, wherein the diffusion current is generated by energizing the closed circuit with the electric currents, to thereby generate the pure spin currents.

As stated above, since the closed circuit is at least formed by the spin injection means, the non-ferromagnetic dot and the electric current source, and since the diffusion current is generated by energizing the closed circuit with the electric currents, to thereby generate the pure spin currents, it is possible to obtain a technical advantages that the pure spin current without the flow of charges can be generated due to the diffusion current by the simple circuit structure.

A magnetic field generation device as disclosed in the present application is characterized by the fact that a ferromagnetic dot is provided in a tip end portion of an interconnection composed of a non-ferromagnetic dot so that at least one part of the ferromagnetic dot is in contact with the interconnection of the non-ferromagnetic dot, the non-ferromagnetic dot having one extension or plural extensions extended rearward away from the tip end portion thereof, a spin injection means, which generates a spin-polarized pure spin current without a flow of charges, being provided in the extension so that at least one part of the spin injection means is in contact therewith, and that the pure spin current flows into the ferromagnetic dot through the intermediary of the interconnection of the non-magnetic body due to a diffusion current by the spin injection means, to thereby generate a magnetic field from the ferromagnetic dot.

As stated above, since the pure spin currents are made to flow from the one extension or plural extensions, which are extended rearward away from the tip end portion, into the ferromagnetic dot which are provided at the tip end portion of the interconnection composed of the non-ferromagnetic dot, through the intermediary of the interconnection of the non-ferromagnetic dot, not only can a size of the device be made small, but also it is possible to generate the magnetic field having a high spatial resolution. Thus, it is possible to obtain a technical advantage that the magnetic field generation device can be utilized as not only a magnetic record device but also a writing-in means for a next generation spin device.

The magnetic field generation device as disclosed in the present application is characterized by the fact that the plural extensions are formed, and that the extensions are radially extended from away from the tip end portion, and are arranged at angular intervals in magnetic field generation directions of the ferromagnetic dot.

As stated above, since a large quantity of pure spin currents can be made to flow from the plural extensions into the ferromagnetic dot, which is provided at the tip end portion of the interconnection of the non-ferromagnetic dot, through the intermediary of the interconnection of the non-ferromagnetic dot, it is possible to obtain a technical advantages that a strong magnetic field can be generated by the ferromagnetic dot The magnetic field generation device as disclosed in the present application is characterized by the fact that the extension is formed into a V-shaped one having two extension portions.

As stated above, since the extension is formed into the V-shaped one having two extension portions, not only can a size of the device be made small, but also it is possible to generate the magnetic field having a high spatial resolution. Thus, it is possible to obtain a technical advantage that the magnetic field generation device can be utilized as not only a magnetic record device but also a writing-in means for a next generation spin device.

The magnetic field generation device as disclosed in the present application is characterized by the fact that the ferromagnetic dot is provided so as to be three-dimensionally buried in the interconnection of the non-ferromagnetic dot.

As stated above, since the ferromagnetic dot is provided so as to be three-dimensionally buried in the interconnection of the non-ferromagnetic dot, it is possible to absorb the pure spin currents in the plural directions, so that the magnetization reversal of the ferromagnetic dot is made possible without being subjected to limitation to configuration and material. Thus, it is possible to obtain a technical advantage that a larger magnetic field can be generated.

The magnetic field generation device as disclosed in the present application is characterized by the fact that the device comprises plural extensions, that at least a first spin injection means and a second spin injection means are provided in the extensions, a relationship between a first injection direction in which a pure spin current is injected by the first spin injection means and a second injection direction in which a pure spin current is injected by the second spin injection means being one except for either a parallel relationship or an antiparallel relationship, and that a ratio of a quantity of the pure spin currents injected by the first spin injection means and the second spin injection means is adjusted in synchronization with a precession of the spins in the ferromagnetic dot so that a pure spin current featured by a vector having an optional direction in a two-dimensional plane is generated to the spins subjected the precession in the ferromagnetic dot, whereby a torque acting on the spins is optimized.

As stated above, since the ratio of the quantity of the pure spin currents injected by the first spin injection means and the second spin injection means is adjusted in synchronization with the precession of the spins in the ferromagnetic dot, and since the pure spin current featured by the vector having the direction, in which the torque acting on the vector of the spins subjected to the precession in the ferromagnetic dot is always optimized, is generated by controlling the directions of the spins, the torque acting on the spins can be optimized in synchronization with the precession of the spins in the ferromagnetic dot. Thus, it is possible to obtain a technical advantage that the magnetization can be speedily reversed with a small electric power. Also, by adjusting the ration of the quantity of the injected pure spin currents, it is possible to electrically control the direction of the vector of the generated pure spin currents.

The magnetic field generation device as disclosed in the present application is characterized by the fact that the element further comprises a third injection means for injecting a pure spin current, which is provided at another an extension except for the extensions in which the first spin injection means and the second spin injection means are provided, that a relationship between a third injection direction in which a corresponding pure spin current is injected by the third spin injection means, the first injection direction and/or the second injection direction is one except for either a parallel relationship or an antiparallel relationship, and that a ratio of a quantity of the pure spin currents injected by the first spin injection means, the second spin injection means and the third spin injection means is adjusted in synchronization with a precession of the spins in the ferromagnetic dot so that a pure spin current featured by a vector having an optional direction is generated to the spins subjected the precession in the ferromagnetic dot, whereby a torque acting on the spins is optimized.

As stated above, since the ratio of the quantity of the pure spin currents injected by the first spin injection means, the second spin injection means and the third spin injection means is adjusted in synchronization with a precession of the spins in the ferromagnetic dot, and since the pure spin current featured by the vector having the direction, in which the torque acting on the vector of the spins subjected to the precession in the ferromagnetic dot is always optimized, is generated by controlling the directions of the spins, the torque acting on the spins can be optimized with respect to the three-dimensional precession of the spins. Thus, it is possible to obtain a technical advantage that the magnetization can be speedily reversed with a smaller electric power. Also, by adjusting the ration of the quantity of the injected pure spin currents, it is possible to electrically control the direction of the vector of the generated pure spin currents.

The magnetic field generation device as disclosed in the present application is characterized by the fact that the device further comprises an electric current source that supplies the spin injection means and the non-ferromagnetic dot with electric currents, and that a closed circuit is at least formed by the spin injection means, the non-ferromagnetic dot and the electric current source, wherein the diffusion current is generated by energizing the closed circuit with the electric currents, to thereby generate the pure spin currents.

As stated above, since the closed circuit is at least formed by the spin injection means, the non-ferromagnetic dot and the electric current source, and since the diffusion current is generated by energizing the closed circuit with the electric currents, to thereby generate the pure spin currents, it is possible to obtain a technical advantages that the pure spin current without the flow of charges can be generated due to the diffusion current by the simple circuit structure.

BRIEF EXPLANATIONS OF DRAWINGS

MODES FOR EMBODYING THE INVENTION

Embodiments of the present invention will now be explained below. It is possible to embody the present invention in various modes. Thus, the present invention should be not be interpreted by only descriptions on the embodiments of the present invention. Also, in the embodiments, the elements similar to each other are indicated by the same reference.

In the embodiments stated below, a flow of spin-polarized electrons without a flow of charges is defined as a pure spin current, and a flow of electrons with a flow of charges is defined as a charge current.

First Embodiment of the Invention

Figure 1:
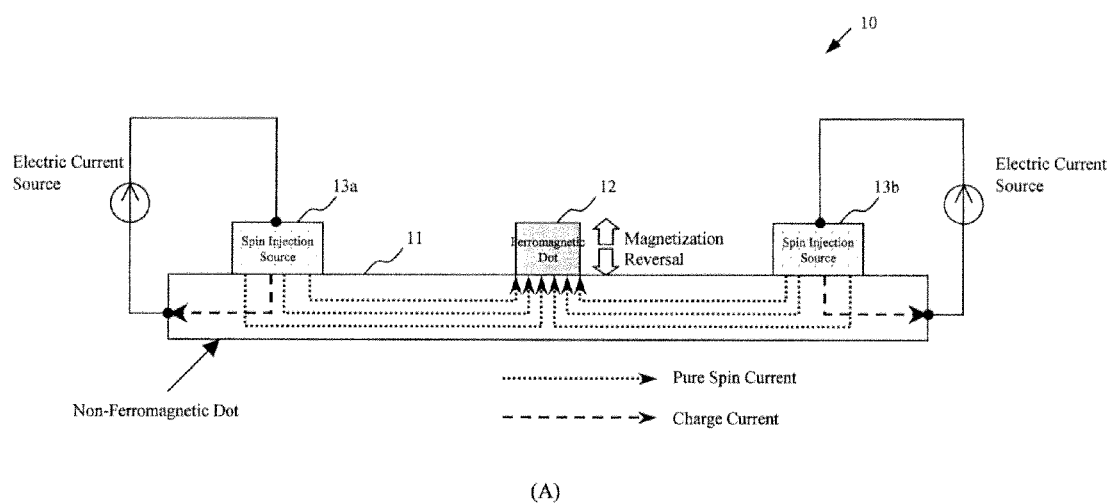
FIG. 1 is a first compositional view of a magnetization reversal device according to a first embodiment.
Figure 1:
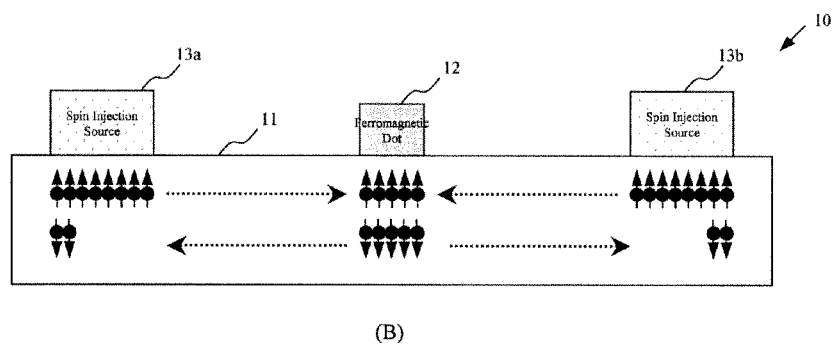
Figure 2:
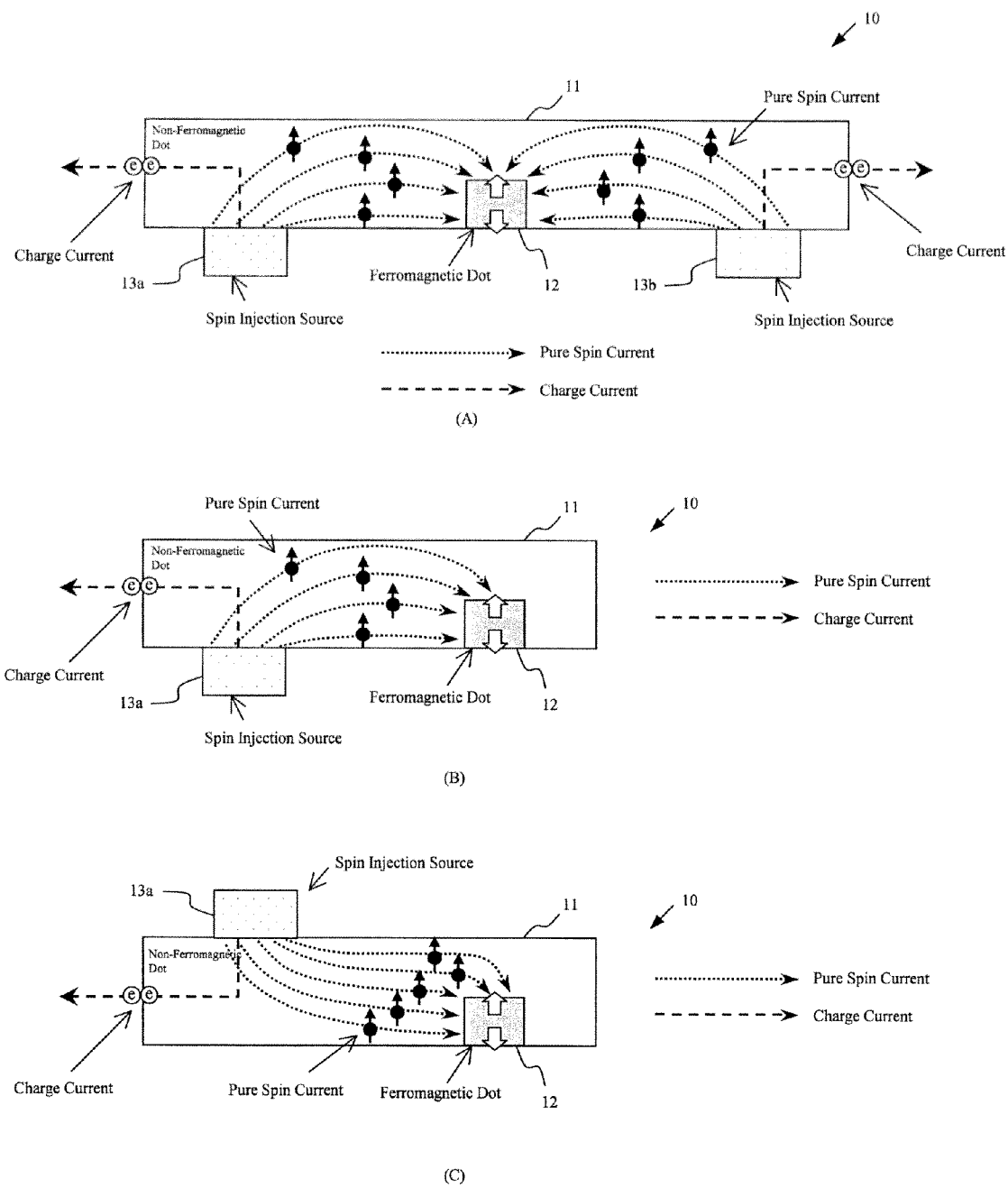
FIG. 2 is a second compositional view of a magnetization reversal device according to the first embodiment.

With reference to FIGS. 1 and 2, a magnetization reversal device according to this embodiment will now be explained. FIG. 1 is a first compositional view of the magnetization reversal device according to this embodiment, and FIG. 2 is a second compositional view of the magnetization reversal device according to this embodiment.

In FIG. 1(A), the magnetization reversal device 10 includes an interconnection composed of a non-ferromagnetic dot 11 (for example, copper, aluminum or the like), a ferromagnetic dot 12 (for example, permalloy, cobalt or the like) which is in contact with the interconnection of the non-ferromagnetic dot 11 at a lower face thereof, and two spin injection sources 13a and 13b (for example, permalloy, cobalt or the like) which are in contact with the interconnection of the non-ferromagnetic dot 11 at respective lower faces thereof. The ferromagnetic dot 12 is arranged between the spin injection sources 13a and 13b. Each of the spin injection sources 13a and 13b defines a closed circuit in the outside of the interconnection of the non-ferromagnetic dot 11 so that a charge current flows into the outside of the interconnection of the non-ferromagnetic dot 11. Also, each of the spin injection sources 13a and 13b not only serves as an electrode, but also defines as a spin-polarized ferromagnetic dot to generate a pure spin current.

Figure 14:
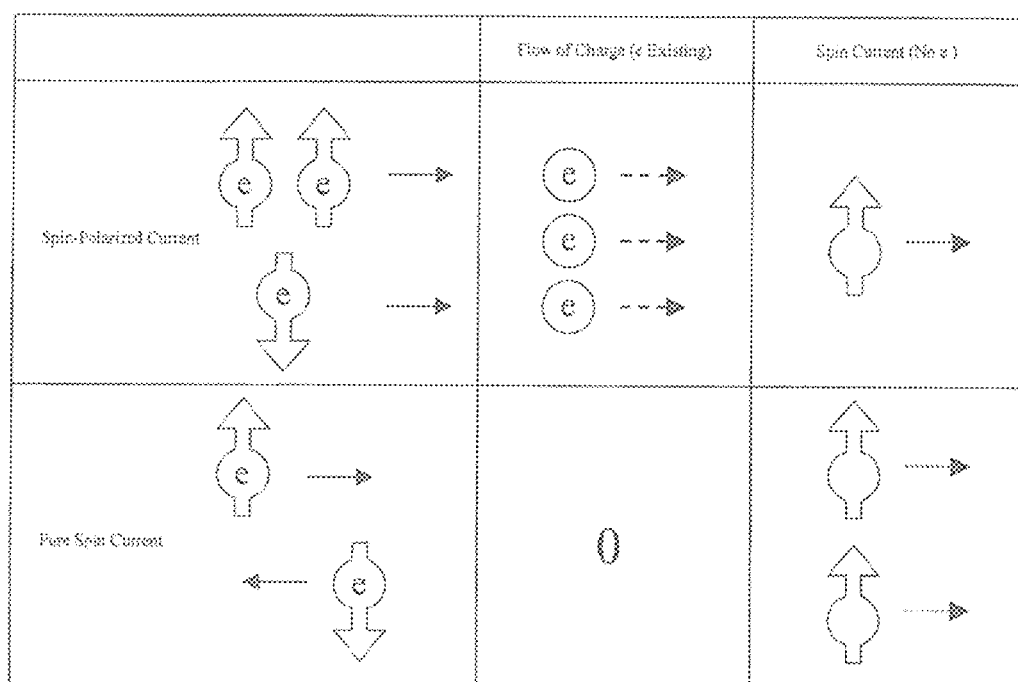
FIG. 14 is a view for explaining a conventional spin current.
Figure 15:
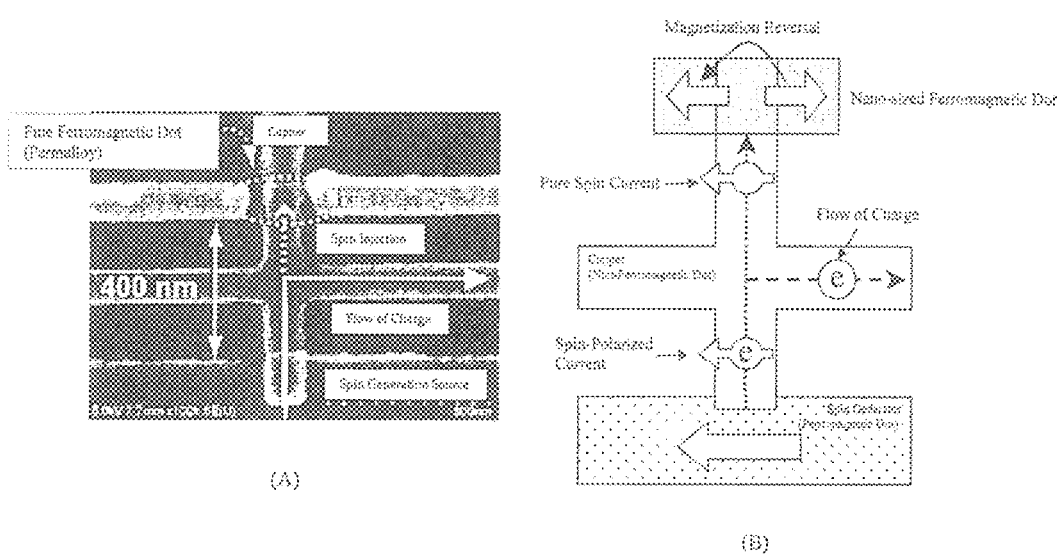
FIG. 15 is views showing an element structure using a conventional spin absorption effect.

When an electric current flows into each of the closed circuits, spin-polarized electrons flow from each of the spin injection sources 13a and 13b into the interconnection of the non-ferromagnetic dot 11. Due to the fact that the spin-polarized electrons flow as a diffusion current in the interconnection of the non-ferromagnetic dot 11, a flow of ↑spin electrons or a flow of ↓spin electrons is caused so as to be directed from the side in which a large number of the corresponding electrons exist toward the side in which a small number of the corresponding electrons exist. For example, as shown in FIG. 1(B), in each of the spin injection sources 13a and 13b, it is supposed that the electrons are polarized into the eight ↑spin electrons and the two ↓spin electrons. Also, the spin polarization is not caused in the interconnection of the non-ferromagnetic dot 11 so that there are the five ↑spin electrons and the five ↓spin electrons therein. When the spin-polarized electrons flow from each of the spin injection sources 13a and 13b into the interconnection of the non-ferromagnetic dot 11, the flow of the ↑spin electrons is caused so as to be directed from each of the spin injection sources 13a and 13b in which the large number of the ↑spin electrons exist toward the ferromagnetic dot 12 in which the small number of the ↑spin electrons exist. On the other hand, the flow of the ↓spin electrons is caused so as to be directed from the ferromagnetic dot 12 in which the large number of the ↓spin electrons exist toward each of the spin injection sources 13a and 13b in which the small number of the ↓spin electrons exist. In short, as shown in FIG. 14, the ↑spin electrons and the ↓spin electrons flow in the reverse directions to each other due to the diffusion current, with which the charge current is compensated, and thus it is possible to generate the pure spin current in which only the spin angular momentum flows.

In the interconnection of the non-ferromagnetic dot 11, it is possible to maintain a spin-polarized nonequilibrium state over a longer period of time in comparison with a case of a ferromagnetic dot. Also, the electrons in the spin-polarized nonequilibrium state have a property to flow in the direction that is easy to relax the nonequilibrium state. In short, the pure spin currents, which are introduced from the spin injection sources 13a and 13b into the interconnection of the non-ferromagnetic dot 11, flow so as to be directed to the ferromagnetic dot 12 in which the nonequilibrium state is more easy to be relaxed (spin absorption effect).

In the magnetization reversal device 10 according to this embodiment, due to the fact that the a large quantity of pure spin currents, which are introduced from the multi-terminal spin injection sources 13a and 13b, are absorbed by the ferromagnetic dot 12, it is possible to easily reverse magnetization of the ferromagnetic dot 12 even if it has a large capacity. Note, it is possible to carry out a control of a direction of the magnetization by controlling a direction in which the electric currents flow.

FIG. 2(A) shows a composition of the magnetization reversal device 10 in which the spin absorption effect is more improved in comparison with the case of FIG. 1. In the case of FIG. 1, the ferromagnetic dot 12 absorbs the pure spin currents only from the lower direction for the lower face (two-dimensional plane) thereof, whereas, in the case of FIG. 2(A), the ferromagnetic dot 12 absorbs the pure spin currents in the plural directions because the ferromagnetic dot 12 is three-dimensionally is buried in the non-ferromagnetic dot 11. In short, since the area for absorbing the pure spin currents is increased, and since the pure spin currents are absorbed in the plural directions, it is possible to facilitate spin absorption efficiency.

Note, in FIG. 1 and FIG. 2(A), although there are the two spin injection sources 13a and 13b, the device may be provided with spin injection sources more than two (13a, 13b, . . . , 13z, . . . ). In this case, when the spin injection sources are arranged, a positional relationship between the spin injection sources must be considered that one of the spin injection sources is not located on a current path along which a pure spin current of another spin injection source flows.

Also, the magnetization reversal device according to this embodiment may be applied to a free layer in an MRAM or the like, or may be used as a magnetic field generation device to magnetically and externally control an MRAM or the like.

Further, as shown in FIG. 2(B), the device may be provided with only one of the spin injection sources 13a and 13b. Furthermore, although it is possible to improve the spin absorption efficiency to the maximum by burying the whole of the ferromagnetic dot 12 in the non-ferromagnetic dot 11, depending on how the device is applied, for example, when the device is applied in a free layer in an MRAM or the like, it is preferable to bury the ferromagnetic dot 12 in the non-ferromagnetic dot 11 so that a part of the ferromagnetic dot 12 is exposed from the non-ferromagnetic dot 11. In this case, the spin injection source 13a or 13b should be located so as to be in contact with the non-ferromagnetic dot 11 in a direction opposite to the direction in which the part of the ferromagnetic dot is exposed, whereby it is possible to improve the spin absorption efficiency. For example, as shown in FIG. 2(C), when the lower face of the ferromagnetic dot 12 is exposed in the lower direction, the spin injection source may be located so as to be in contact with the non-ferromagnetic dot 11 in the direction of the upper face which is opposite to that lower direction.

As stated above, in the magnetization reversal device according to this embodiment, due to the diffusion current derived from the plurality of spin injection sources, the large quantity of pure spin currents flow into the ferromagnetic dot so that it is possible to reverse magnetization of the ferromagnetic dot even if it is a thick film ferromagnetic dot. Also, since the magnetization reversal of the thick film ferromagnetic dot is made possible, it can be prevented that the spins become unstable by thermal disturbance. Further, since there is no generation of Joule's heat by the charge current due to the compensation of the electric charges, an electrical material for an electrode is subjected to no limitation, and it is possible to prevent decline in a reduction of the magnetoresistance charge.

Also, since the ferromagnetic dot is three-dimensionally buried in the non-ferromagnetic dot, a junction area is increased so that the ferromagnetic dot can absorb the pure spin currents from the plural direction, resulting in considerable improvement in the spin absorption effect of the pure spin currents.

Second Embodiment of the Invention

Figure 3:
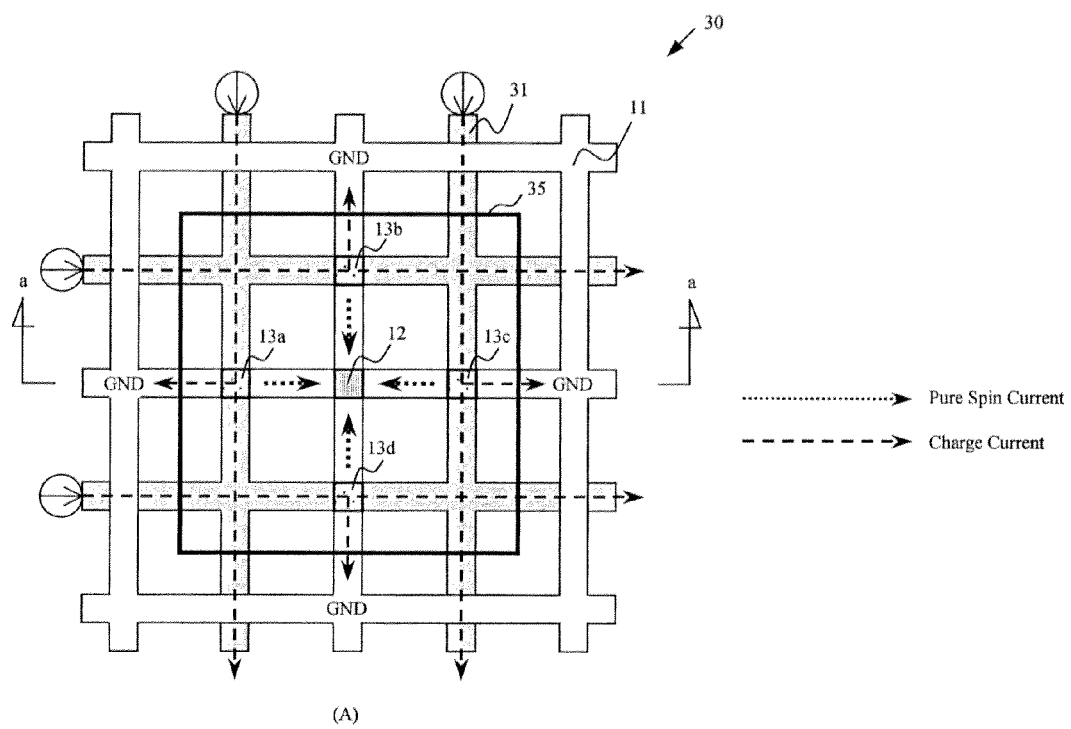
FIG. 3 is a first plan view of a memory element according to a second embodiment, and a cross-sectional view of the first plan view.
Figure 3:
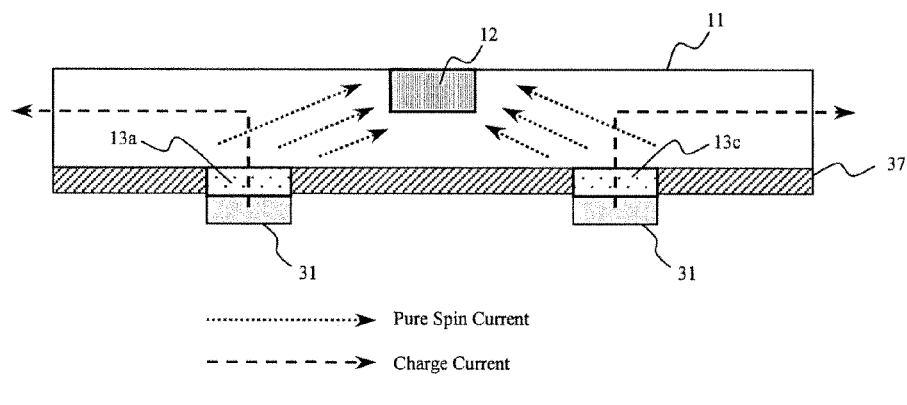
Figure 4:
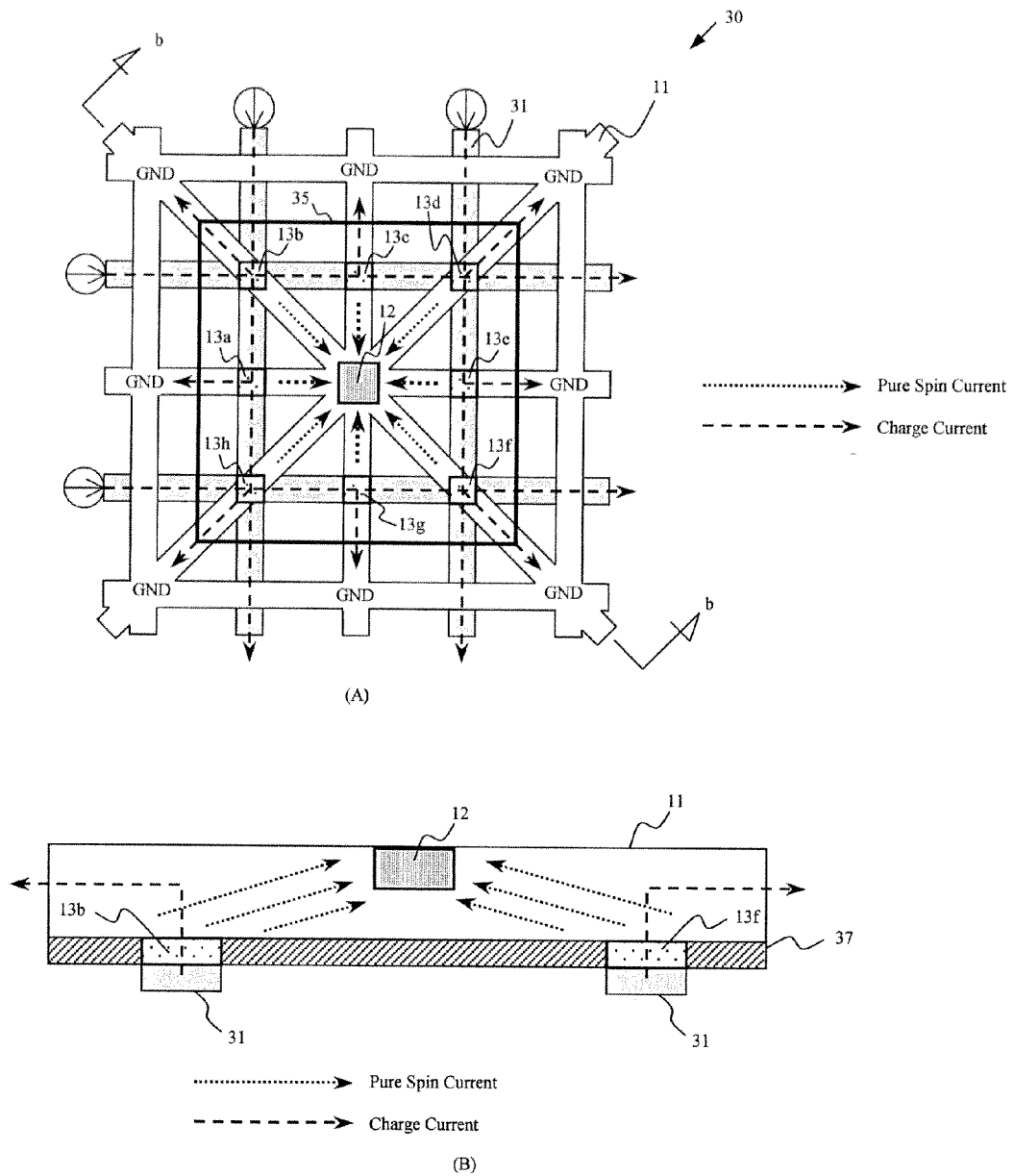
FIG. 4 is a second plan view of a memory element according to the second embodiment, and a cross-sectional view of the second plan view.

With reference to FIGS. 3 and 4, a memory element according to this embodiment will now be explained. FIG. 3 is a first plan view of the memory element according to this embodiment, and a cross-sectional view of the first plan view. FIG. 4 is a second plan view of the memory element according to this embodiment, and a cross-sectional view of the second plan view.

In FIG. 3(A), the memory element 30 includes an interconnection composed of a non-ferromagnetic dot 11 which is formed into a matrix-like configuration, an interconnection composed of a conductor body 31 for supplying an electric current, a ferromagnetic dot 12 placed at a point of intersection in the interconnection of the non-ferromagnetic dot 11, and spin injection sources 13a, . . . , and 13d placed at points at which the interconnection of the non-magnetic body 11 and the interconnection of the conductor body 31 are intersected with each other in the vicinity of the point of interconnection at which the ferromagnetic dot 12 is placed. Note, the non-ferromagnetic dot 11 and the conductor body 31 may be composed of the same material, or these bodies may be composed of different materials.

The ferromagnetic dot 12 is arranged to be buried in the interconnection of the non-ferromagnetic dot 11, and thus comes three-dimensionally in contact with the interconnection of the non-ferromagnetic dot 11. The spin injection sources 13a, . . . , and 13d are arranged so as to be at least partially in contacted with the interconnection of the non-ferromagnetic dot 11. Also, in the spin injection sources 13a, . . . , and 13d, grounds are defined in the directions opposite (i.e., the outside directions of the matrix-like shape) to a direction in which the ferromagnetic dot 12 is disposed.

FIG. 3(B) is the cross-sectional view when being observed in arrows a of FIG. 3(A). The ferromagnetic dot 12 is buried in the interconnection of the non-ferromagnetic dot 11, and the spin injection sources 13a and 13c are placed on the interconnection of the non-ferromagnetic dot 11 so that their upper faces are in contact therewith. As a lower layer of the interconnection of the non-ferromagnetic dot 11, an insulating layer 37 (not shown in FIG. 3(A)) is formed on the area except for the spin injection sources 13a and 13c, and the conductor body 31 is formed over lower faces of the spin injection sources 13a and 13c.

Electric currents supplied from electric current sources flow into not only the conductor body 31 in directions indicated by broken arrows, but also the spin injection sources 13a-13d, the lower faces of which are in contact with the conductor body 31. The electric currents, which flow into the spin injection sources 13a-13d further, flow into the grounds, and then escape out of the interconnection of the non-ferromagnetic dot 11 into the outside, as indicated by broken lines in FIG. 3(B). That is, similar to the case of the first embodiment, due to the spin injection sources 13a-13d, pure spin currents are generated from the multi-terminal spin injection sources (four in this embodiment), as indicated by dotted line in FIG. 3(B). Thus, due to the spin absorption effect, the ferromagnetic dot 12 absorbs the spins so that magnetization thereof can be reversed.

It is possible to carry out a control of the magnetization reversal by controlling the directions of the electrical currents, and selection of the spin injection sources 13a-13d to be driven can be controlled by combination of partial configurations of the conductor body 31 through which the electric currents should flow. In the memory element 30, one bit of information is stored in a block area 35 of FIG. 3(A).

FIG. 4(A) shows the memory element of FIG. 3(A) in which the interconnection of the non-ferromagnetic dot 11 is configured so as to further include a perpendicularly and diagonally intersected portion. In this arrangement, a ferromagnetic dot 12 can absorb pure spin currents from spin injection sources 13a-13h placed at 8 points of intersection which are adjacent to a point of intersection at which the ferromagnetic dot 12 is placed, whereby it is possible to further improve the spin absorption efficiency. Also, as shown in FIG. 4(B), in the cross-section taken along a diagonal direction (i.e., a direction indicated by arrows b in FIG. 4(A)), similar to the case of FIG. 3(B), it can be understood that the spins are absorbed by the ferromagnetic dot 12 from the spin injection sources 13b and 13f.

Note that the memory element according to this embodiment may include only one spin injection source 13. For example, in the case of FIG. 3, the electric current is made to flow into only the vertical line of the conductor body 31 on which the spin injection source 13a is placed, whereby the injection of the spins from only one spin injection source can be carried out. Also, for example, the electric currents are made to flow into the vertical lines of the conductor body 31 on which the spin injection sources 13a and 13 are placed, whereby the injection of the spins from two spin injection sources 13 can be carried out.

As stated above, the ferromagnetic dot is placed at an optional point of intersection in the interconnection of the conductor body which includes the non-ferromagnetic dot formed into the matrix-like configuration, and a spin injection means is placed at another point of intersection which is adjacent thereto through the intermediary of the interconnection of the non-ferromagnetic dot, whereby not only can a large quantity of pure spin currents be absorbed by the ferromagnetic dot, but also the magnetization of the thick film ferromagnetic dot featuring spin thermal disturbance durability can be reversed with low power consumption, so that it is possible to securely and stably carry out a writing of a bit of information.

Also, when the interconnection of the non-ferromagnetic dot is configured so as to include not only a perpendicular intersection in vertical and horizontal directions but also an another perpendicular intersection in diagonal directions, a number of the spin injection means can be increased so that a further large quantity of pure spin currents can be absorbed by the ferromagnetic dot, whereby it is possible to reverse the magnetization of a further large ferromagnetic dot. Thus, the memory element can be utilized as a next generation memory featuring a superior heat stability.

Third Embodiment of the Invention

Figure 5:
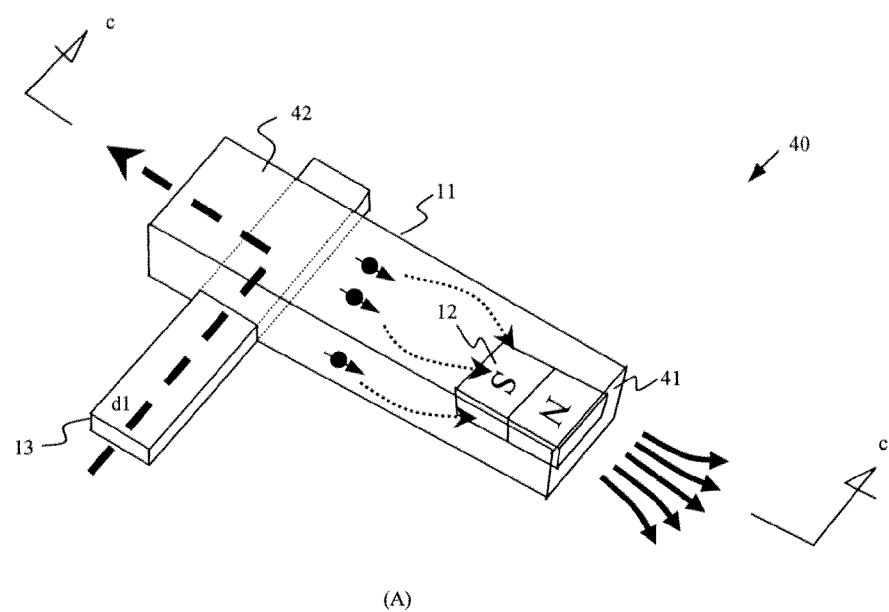
FIG. 5 is a first whole perspective view of a magnetic field generation device according to a third embodiment, and a cross-sectional view thereof.
Figure 5:
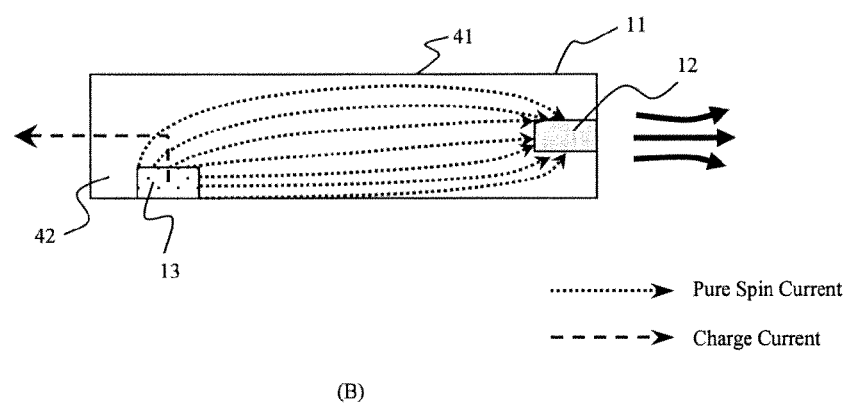
Figure 6:
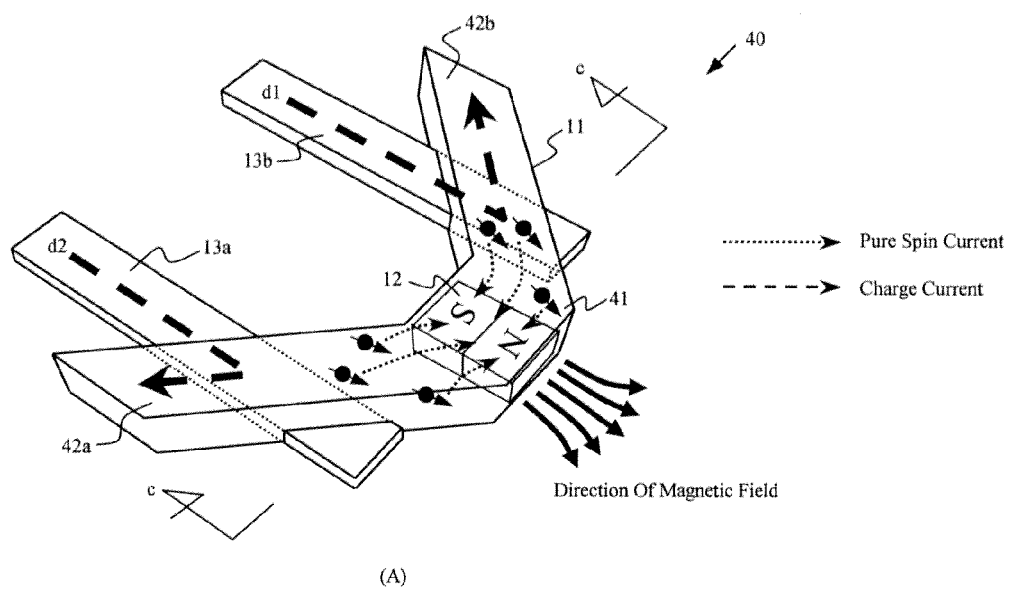
FIG. 6 is a second whole perspective view of a magnetic field generation device according to the third embodiment, and a cross-sectional view thereof.
Figure 6:
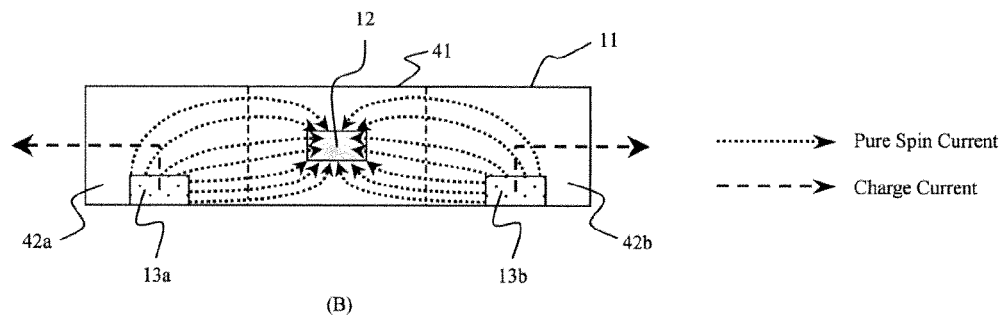
Figure 7:
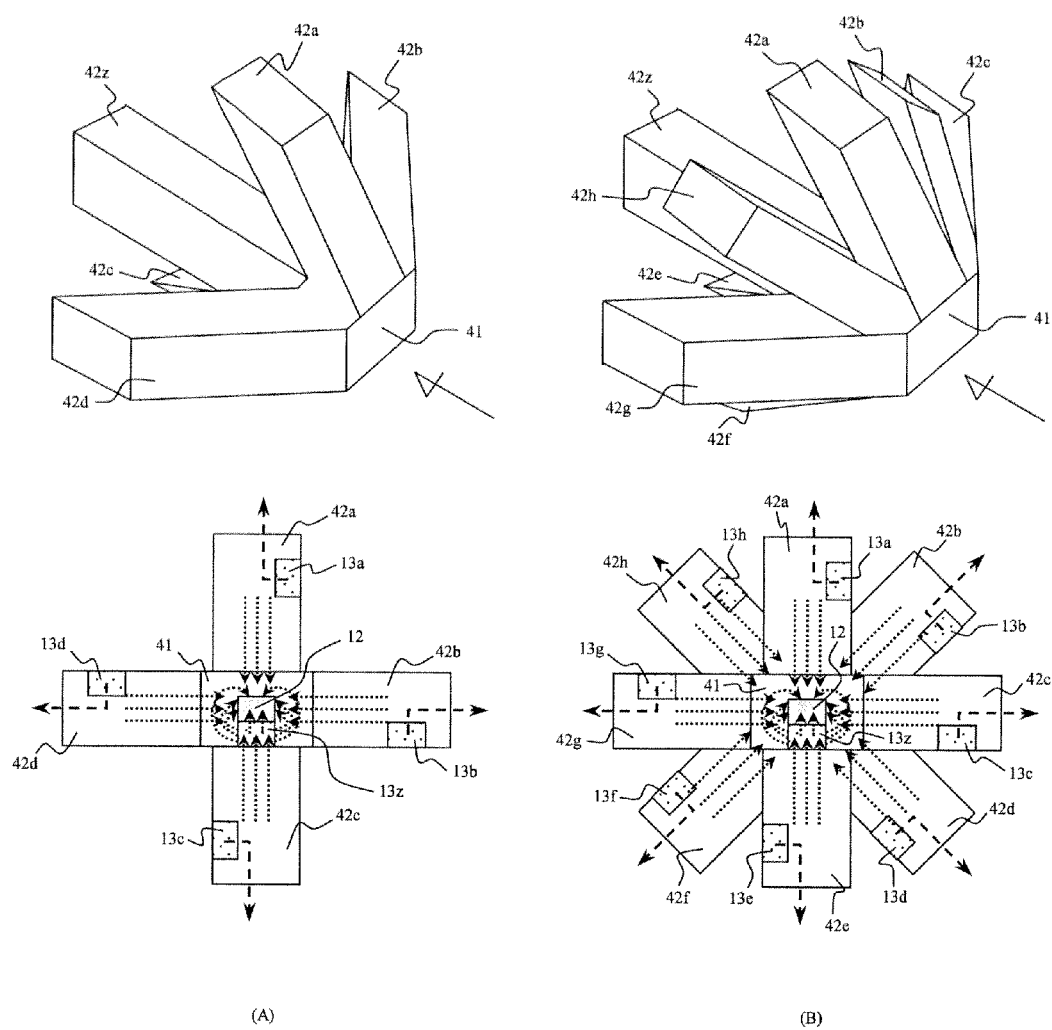
FIG. 7 is views showing other shapes of a magnetic field generation device according to the third embodiment.

With reference to FIGS. 5 to 7, a magnetic field generation device according to this embodiment will now be explained.

FIG. 5 is a first whole perspective view of the magnetic field generation device according to this embodiment, and a cross-sectional view thereof.

As shown in the aforesaid first and second embodiments, it is possible to carry out of a control of a magnetization direction of a ferromagnetic dot with pure spin currents by controlling electric currents. Also, by injecting the spin currents which are in parallel with the magnetization direction, a ferromagnetic coupling effect based on a spin torque is obtained so that the magnetization direction in a fine ferromagnetic dot can be strongly fixed in a direction of the injected spins.

Therefore, in this embodiment, reference is made to the magnetic field generation device which is applicable to a magnetic head or the like wherein a magnetic field, which is generated at a tip end of a fine ferromagnetic dot strongly magnetized, can be used, for example, as a writing-in magnetic field for a magnetic memory medium.

In FIG. 5(A), the magnetic field generation device 40 includes an interconnection composed of a non-magnetic body 11 having a tip end portion 41 and an extension 42 extended rearward away from the tip end portion 41, a ferromagnetic dot 12 buried in the tip end portion 41 of the interconnection of the non-ferromagnetic dot 11, and a spin injection source 13, a part of which is at least buried in the extension 42. A magnetic field generation direction of the ferromagnetic dot 12 buried in the tip end portion 41 is indicated by arrows shown in FIG. 5(A). When the magnetic field is reversed by the pure spin currents, the magnetic field generation direction is opposite to the arrows. As stated above, the reason why the extension 42 extends rearward from the tip end portion 41 is to prevent influence of the magnetic field, which is generated from the spin injection source 13 buried in the extension 42, on an object which is placed in front of the tip end portion 41 so as to be subjected to a magnetic field control.

FIG. 5(B) is the cross-sectional view when being observed in arrows c of FIG. 5(A). Similar to the case of the aforesaid first embodiment, when the electric currents are supplied from the spin injection source 13 in an outside direction (indicated by an arrow d1 shown in FIG. 5(A)) in the interconnection of the non-ferromagnetic dot 11, the spin-polarized electrons flow as a diffusion current, to thereby generate the spin currents. The generated pure spin currents are absorbed by the ferromagnetic dot 12 due to the spin absorption effect so that the magnetization direction in the ferromagnetic dot 12 is strongly fixed by the spin torque, whereby it is possible to generate the strong magnetic field. Further, by reversing the electric current direction, it is possible to reverse the magnetic field generation direction.

FIG. 6 is a second whole perspective view of the magnetic field generation device according to this embodiment, and a cross-sectional view thereof. In FIG. 6(A), the magnetic field generation device 40 includes an interconnection composed of a non-magnetic body 11 having a tip end portion 41 and extensions 42a and 42b extended from the tip end portion 41 in a V-shaped manner, a ferromagnetic dot 12 buried in the tip end portion 41 of the interconnection of the non-ferromagnetic dot 11, and spin injection sources 13a and 13b, parts of which are at least buried in the respective extensions 42a and 42b. A magnetic field generation direction of the ferromagnetic dot 12 buried in the tip end portion 41 is indicated by arrows shown in FIG. 6(A). When the magnetic field is reversed by the pure spin currents, the magnetic field generation direction is opposite to the arrows. As stated above, the reason why the extensions 42a and 42b extends rearward away from the tip end portion 41 is to prevent influence of the magnetic fields, which are generated from the spin injection sources 13 and 13b buried in the respective extensions 42a and 42b, on an object which is placed in front of the tip end portion 41 so as to be subjected to a magnetic field control.

FIG. 6(B) is the cross-sectional view when being observed in arrows c of FIG. 6(A). Similar to the case of the aforesaid first embodiment, when the electric currents are supplied from the spin injection sources 13a and 13b in outside directions (indicated by arrows d1 and d2 shown in FIG. 6(A)) in the interconnection of the non-ferromagnetic dot 11, the spin-polarized electrons flow as a diffusion current, to thereby generate the spin currents. The generated pure spin currents are absorbed by the ferromagnetic dot 12 due to the spin absorption effect so that the magnetization direction in the ferromagnetic dot 12 is strongly fixed by the spin torque, whereby it is possible to generate the strong magnetic field. Further, by reversing the electric current direction, it is possible to reverse the magnetic field generation direction.

Note that it is possible to carry out a control of the magnetic field generation direction by a direction in which the electric currents flow into the spin injection sources 13a and 13b. For example, by making the electric currents to flow in the respective directions opposite to the directions indicated by the arrows d1 and d2 shown in FIG. 6(A), it is possible to reverse the magnetic field generation direction. Also, by making the electric current to flow into one of the spin injection sources 13a and 13b in the direction indicated by a corresponding arrow (for example, the arrow d1), and by making the electric current to flow into the other spin injection source in the reverse direction opposite to the direction indicated by the other arrow (for example, the arrow d2), it is possible to reduce a strength of the magnetic field to be generated. In short, by injecting the pure spin currents from both the sides of the ferromagnetic dot 12 thereinto in the directions opposite to each other, the reverse spin torque acts on the ferromagnetic dot so that a magnetic multidomain structure is formed in the ferromagnetic dot 12, whereby the magnetic field generated from the magnetic pole abruptly declines. Thus, for example, when the magnetic field generation device is used as a writing-in head, it is possible to avoid a writing-in error such as a pole erasure or the like.

Also, the non-ferromagnetic dot 11 is not limited to the V-shape as shown in FIG. 6. By way of example, FIG. 7 is views showing other shapes of the magnetic field generation device according to this embodiment. In FIG. 7(A), a magnetic field generation device 40 includes an interconnection composed of a non-ferromagnetic dot 11 having a tip end portion 41 and five extensions 41a-41d and 41z extended from the tip end portion 41, with the four extensions 41a-41d being radially extended from away from the tip end portion 41, and being arranged at angular intervals in magnetic field generation directions of a ferromagnetic dot 12. Also, in FIG. 7(B), a magnetic field generation device 40 includes an interconnection composed of a non-ferromagnetic dot 11 having a tip end portion 41 and nine extensions 41a-41h and 41z extended from the tip end portion 41, with the eight extensions 41a-41h being radially extended from away from the tip end portion 41, and being arranged in angular intervals in magnetic field generation directions of a ferromagnetic dot 12.

In each of the magnetic field generation devices 40, the respective extensions have spin injection sources, respective parts of which are at least buried in the extensions, and thus the polarized spins are injected from the spin injection sources. In short, in the case of FIG. 7(A), the ferromagnetic dot 12 absorbs the spin currents from the five spin injection sources 13a-13d and 13z, and, in the case of FIG. 7(B), the ferromagnetic dot 12 absorbs the spin currents from the nine spin injection sources 13a-13h and 13z.

Accordingly, since a cross-sectional area of the ferromagnetic dot 12, which features large magnetization, and which functions as the magnetic field generation device, is made to be very fine, it is possible to generate a spatially steep and strong magnetic field. Also, since the ferromagnetic dot can have a longitudinally sufficient length, it is possible to improve a heat stability of the ferromagnetic dot. Further, due to the spin injection in the plural directions, although the volume of the ferromagnetic dot is increased, it is possible to reverse the magnetization by the spin injection. In the magnetic field generation device 40 according to this embodiment, it is possible to realize a magnetization control of a ferromagnetic dot having a thickness of 10 nm or more than 10 nm.

Note, in FIGS. 5 and 7, the ferromagnetic dot 12 may be arranged so as to be in two-dimensional or three-dimensional contact with the interconnection of the non-ferromagnetic dot 11. If it is desired that the spin absorption effect is more facilitated, it is preferable that the ferromagnetic dot 12 is in three-dimensional contact with the non-ferromagnetic dot.

As stated above, since the large quantity of pure spin currents flow into the ferromagnetic dot provided in the tip end portion of the interconnection composed of the non-magnetic body through the intermediary of the interconnection of the non-magnetic body, it is possible to generate the strong magnetic field by the ferromagnetic dot.

Also, in the case where the extension is formed into the V-shaped one having the two extension portions, not only can a size of the device be made small, but also it is possible to generate the magnetic field having a high spatial resolution, and thus the magnetic field generation device can be utilized as not only a magnetic record device but also a writing-in means for a next generation spin device.

Further, in the case where the ferromagnetic dot is buried in the interconnection of the non-magnetic body, not only can a junction area therebetween be increased, but also the ferromagnetic dot can absorb the pure spin currents in the plural directions, and thus the magnetization reversal of the ferromagnetic dot is made possible without being subjected to limitation to configuration and material so that it is possible to generate a larger magnetic field.

Furthermore, in the case where the magnetic field generation is utilized as a magnetic head, since a coil or the like is unnecessary, not only can a structure of an element be very simplified, but also it is possible to realize a light weight of the element, resulting in a very large contribution to miniaturization of a memory device. Also, eddy currents are not generated in the ferromagnetic dot, and thus a high speed operation is made possible so that power consumption can be considerably cut off when a piece of information is written in the memory device.

Fourth Embodiment of the Invention

Figure 8:
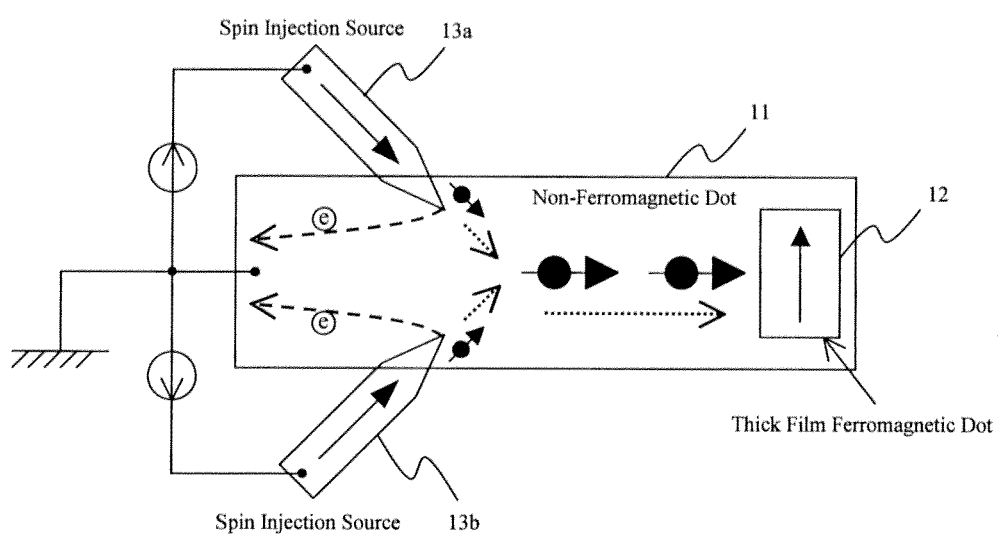
FIG. 8 is a view showing a control of a spin in the magnetization reversal device according to a fourth embodiment.
Figure 9:
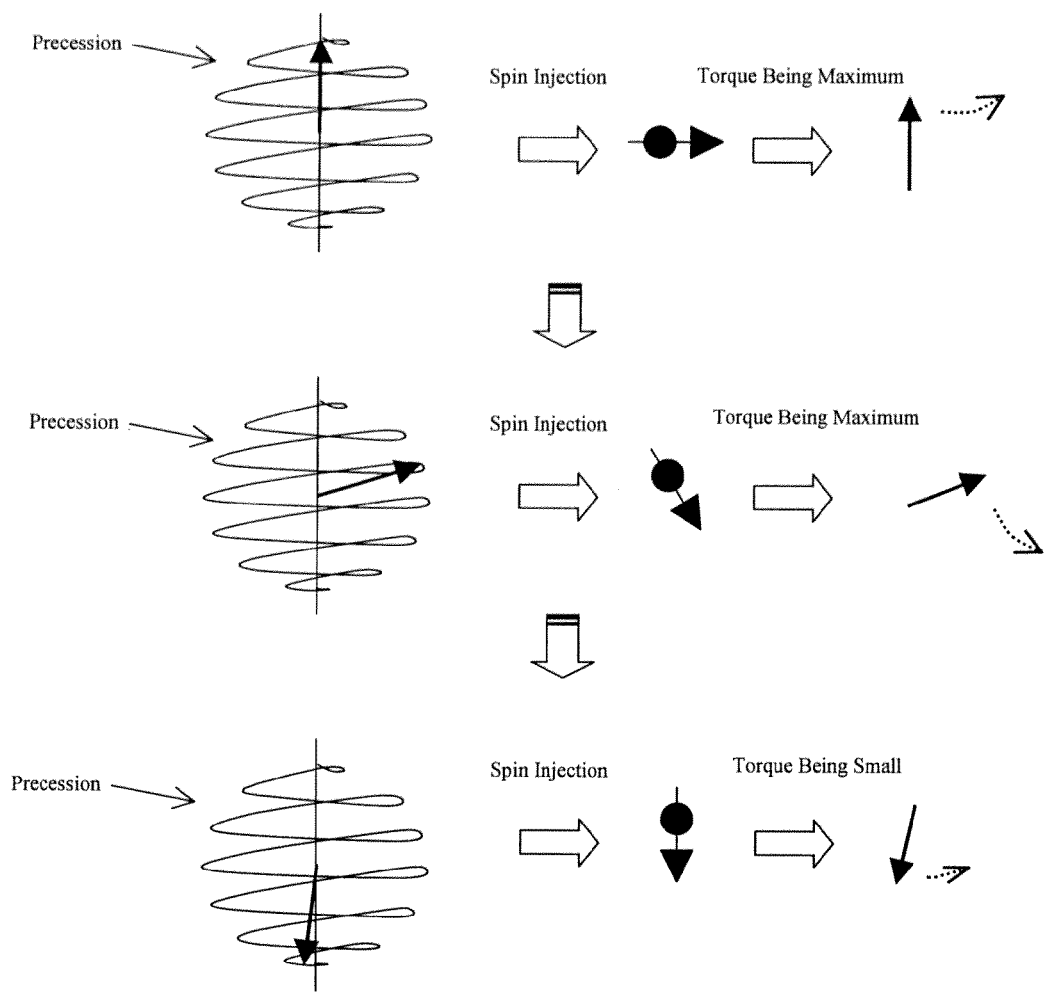
FIG. 9 is views showing precessions of the magnetization reversal device according to the fourth embodiment.
Figure 10:
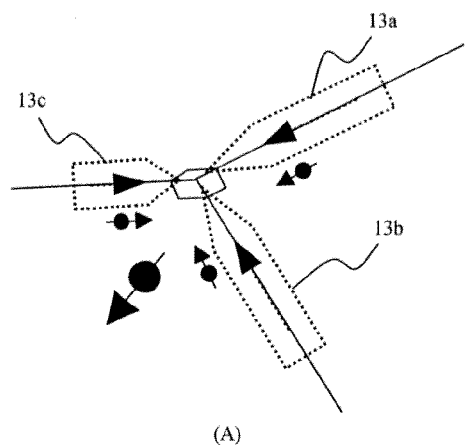
FIG. 10 is views showing cases where the magnetization reversal device according to this embodiment has three spin injection sources.
Figure 10:
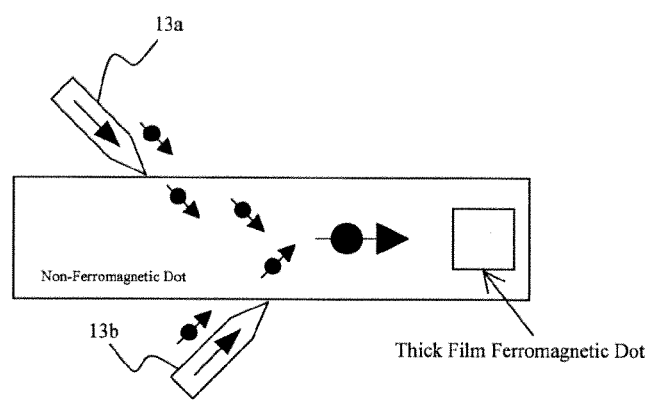
Figure 10:
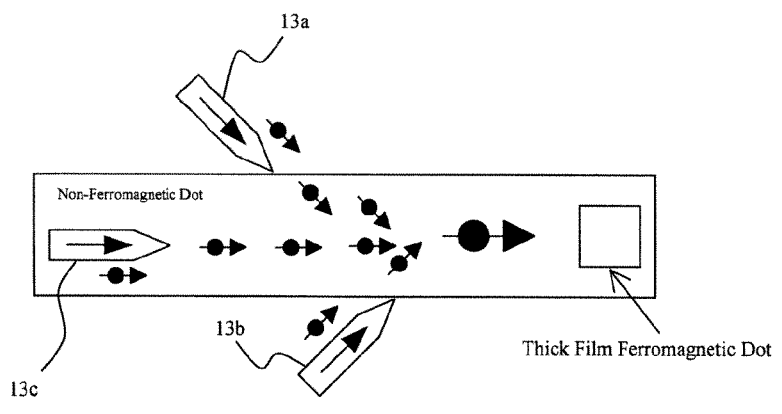

With reference to FIGS. 8 to 10, a magnetization reversal device according to this embodiment will be explained below. FIG. 8 is a view showing a control of a spin in the magnetization reversal device according to this embodiment; FIG. 9 is views showing precessions of the magnetization reversal device according to this embodiment; and FIG. 10 is views showing cases where the magnetization reversal device according to this embodiment has three spin injection sources.

In this embodiment, two or three spin injection sources 13 are used, and a direction of a spin injected in synchronization with a precession of the spin in the ferromagnetic dot 12 is controlled, resulting in improvement of a reversal speed of the spin in the ferromagnetic dot 12. A spin torque for driving the reversal of the spin is in proportion to an exterior product of the magnetization and the injected spin. In a case where a spin current which is in antiparallel with the direction of the magnetization is injected, since a small precession in the magnetization is excited, and since the torque is increased by continuously injecting the spin to thereby realize the magnetization reversal, an initial torque is very small so that a large quantity of precession is needed in the magnetization reversal, and thus a reversal speed is small to thereby need a large quantity of electric power. On the other hand, in a case where a spin current which is perpendicular to the direction of the magnetization is injected, the initial torque becomes larger so that it is possible to carry out the magnetization reversal with a small quantity of precession in the magnetization reversal. Further, since the direction of the spin is controlled and optimized in synchronization with the precession, it is possible to carry out the magnetization reversal with a smaller quantity of precession.

As shown in FIG. 8, it is possible to control directions of spins by injection directions of spins, i.e., angles of electrodes in spin injection sources 13a and 13b, and by ratios of electric currents flowing into the respective electrodes (see: for example, Non-Patent Document 9). In this embodiment, by using this control, the reversal speed of the spin in the ferromagnetic dot 12 is improved. That is, as shown in FIG. 9, the current ratios of the spin injection sources 13a and 13b are adjusted so that the torque is optimized in synchronization with the precession of the spins in the ferromagnetic dot 12. For example, over a period from an initial reversal stage to a middle reversal stage, the adjustment is carried out so that the torque becomes larger by making vectors of the spins in the ferromagnetic dot 12 to be perpendicular to vectors of the spins injected from the spin injection sources 13. Then, over a period of an end reversal stage, the adjustment is carried out so that the torque becomes smaller by making the vectors of the spins in the reversing ferromagnetic dot 12 and the vectors injected from the spin injection sources 13 to be gradually oriented in the same direction. Thus, it is possible to always obtain the optimized torque, resulting in improvement of the reversal speed of the spins in the ferromagnetic dot 12.

Also, as shown in FIG. 10(A), by adding a third spin injection source 13c to the spin injection sources 13a and 13b of FIG. 8, it is possible to three-dimensionally control the direction of the spins. As shown in FIG. 9, by injecting the three-dimensionally synchronized spins from the spin injection sources 13a, 13b and 13c into the precession of the spins in the ferromagnetic dot 12, it is possible to more efficiently reverse the magnetization.

Note that the electrodes of the spin injection sources are arranged at respective angles so that either a parallel relationship or an antiparallel relationship is not established therebetween (i.e., so that an intersection relationship is established between the directions of the electrodes or so that a skewed positional relationship is established therebetween). Especially, as shown in FIGS. 8 and 10(A), when the electrodes are arranged so that an angle of 90° is defined therebetween, a vector calculation can be easily carried out so that it is possible to easily adjust a current ratio.

In the case where the direction of the spins is controlled by using the multi-terminal spin injection sources, there is no problem as long as the spins injected from the spin injection sources are composed when the spins are absorbed by the ferromagnetic dot 12. That is, as shown in FIGS. 10(B) and 10(C), there is no problem on the positional relationship of the spin injection sources as long as the angular conditions of the electrodes of the spin injection sources is satisfied. Thus, in an integration of a device such as an MRAM or the like, it is possible to increase a flexibility about a positional relationship in which spin injection sources are arranged, and the device can be miniaturized.

Note that the technique for controlling the direction of the spins injected in synchronization with the precession of the spins in the ferromagnetic dot 12 using the two or three spin injection sources in this embodiment may be applied to the memory element 30 of the aforesaid second embodiment and the magnetic field generation device 40 of the aforesaid third embodiment. That is, in the case of the memory element 30, it is possible to control the direction of the spins using any two or three of the spin injection sources 13a-13d (or the spin injection sources 13a-13h) which are arranged at the points of intersection between the interconnection of the non-magnetic body 11 and the interconnection of the conductor body 31, and which are adjacent to the point of intersection at which the ferromagnetic dot 12. In this case, the two or three spin injection sources are used so that the positional relationship (such as the intersection relationship or the skewed positional relationship) except for either the parallel relationship or the antiparallel relationship is established between the directions in which the spins are injected from the spin injection sources. Especially, in a case where the three spin injection sources are used, for example, in addition to 13a and 13b or 13c and 13d shown in FIG. 3(A), by utilizing spins injected from a spin injection source provided in either an upper layer or a lower layer with through vias (injected from either a upper direction or a lower direction), it is possible to carry out a three-dimensional control.

In the magnetic field generation device 40, by utilizing any two or three of the spin injection sources 13a and 13b (or the spin injection sources 13a-13h and 13z) provided in the extensions 42a and 42b (or the extensions 42a-42b and 42z), it is possible to control the direction of the spins. In this case, the utilized two or three spin injection sources are arranged so that the positional relationship (such as the intersection relationship or the skewed positional relationship) except for either the parallel relationship or the antiparallel relationship is established therebetween. For example, in the case of FIG. 5(A), the spin injection source 13a and the spin injection source 13b are arranged so that either the parallel relationship or the antiparallel relationship is not established between the spin injection directions thereof.

Note that the multi-terminal spin injection sources may be divided into two or three groups so that the directions of the spins can be controlled by utilizing the two or three groups.

Although the present invention is explained based on the above-mentioned embodiments, it will be understood that the technical scope of the present invention is not limited to the descriptions of the embodiments, and that various changes and modifications may be made to each of the embodiments. Further, embodiments to which the various changes and modifications are made should be included in the technical scope of the present invention. This is apparent from the descriptions of "SCOPE OF CLAIM" and "MEANS FOR SOLVING THE PROBLEMS".

Example

Figure 11:
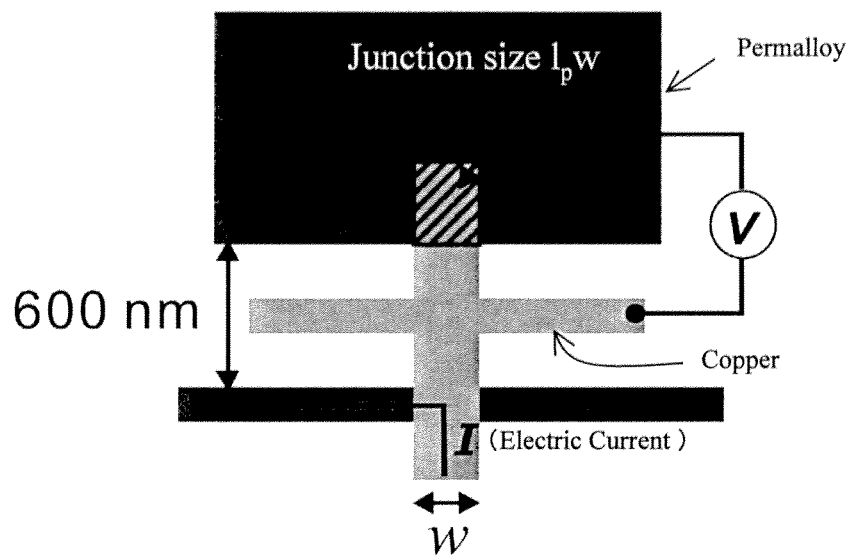
FIG. 11 is a view showing an element structure according to an embodiment of the present invention.

With respect to spin absorption efficiency of a ferromagnetic dot, a test was carried out to research how the spin absorption efficiency is dependent on a junction area between a ferromagnetic dot and a non-ferromagnetic dot. In an element structure as shown in FIG. 11, while varying a junction area lpw between a ferromagnetic dot (permalloy) and a non-ferromagnetic dot (copper), a voltage (resistance) between the ferromagnetic dot and the non-ferromagnetic dot was measured. In this case, a voltage was constant on the spin injection side, and only the junction area between the ferromagnetic dot and the non-ferromagnetic dot was changed.

Figure 12:
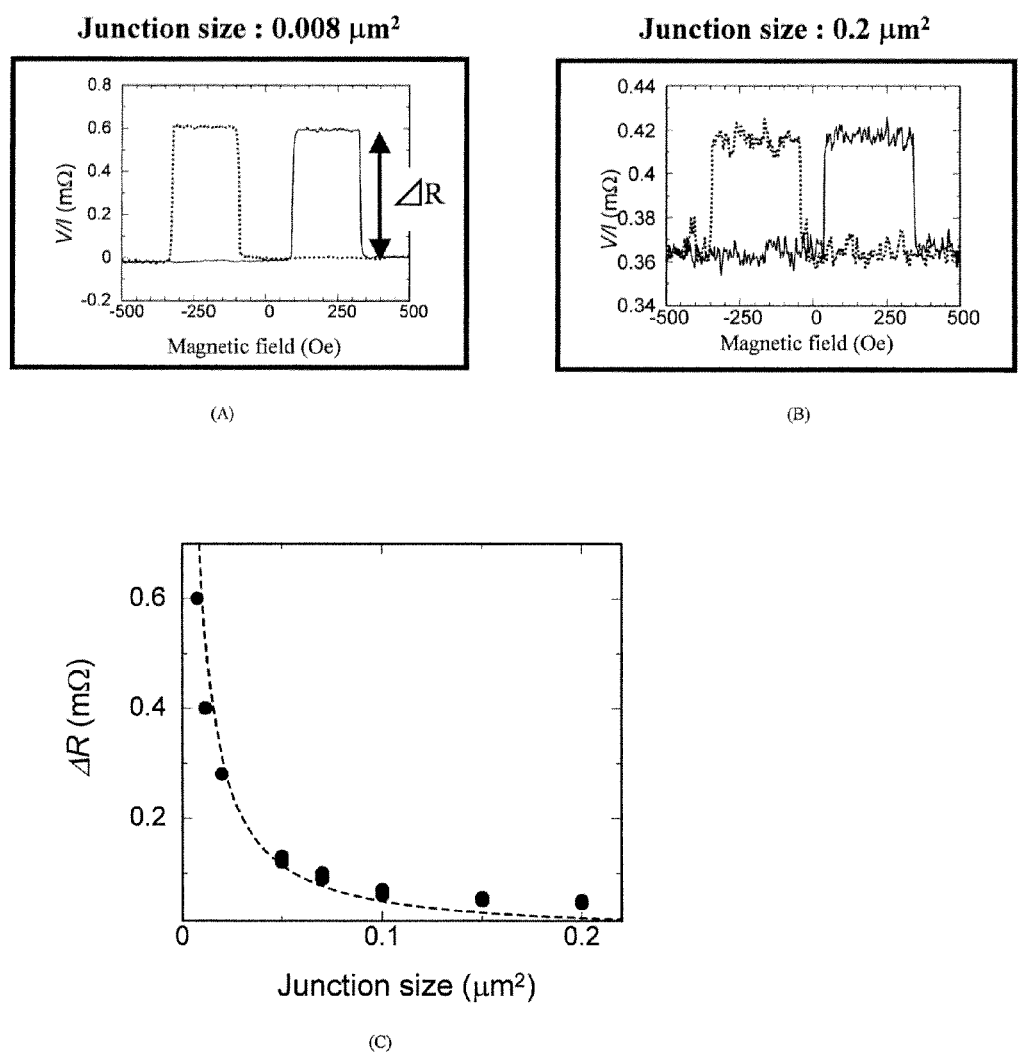
FIG. 12 is views showing results in the embodiment of the present invention.
Figure 13:
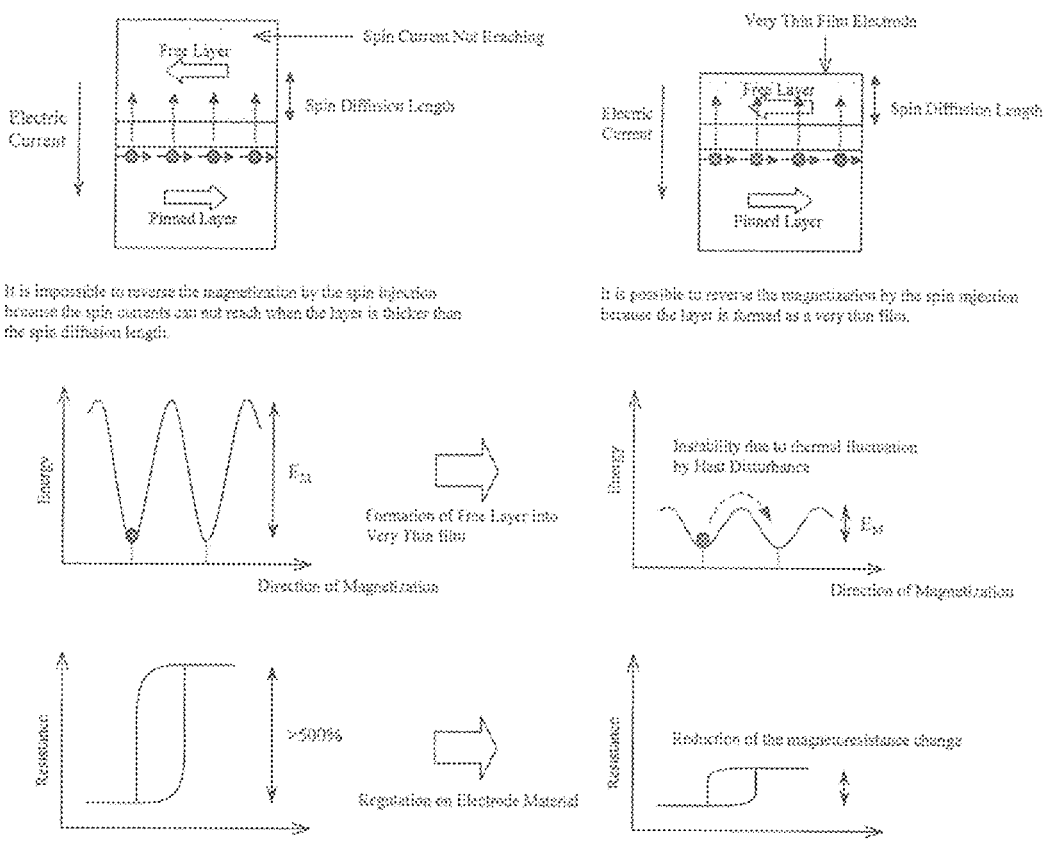
FIG. 13 is views showing problems occurred when a magnetization reversal is carried out in a conventional spin injection manner.

FIG. 12 shows the measurement results. FIG. 12(A) shows a variation of a magnetic resistance to a magnetic field sweep when the junction area is 0.008 $\mu m^2$; FIG. 12(B) shows a variation of a magnetic resistance to a magnetic field sweep when the junction area is 0.2 $\mu m^2$; and FIG. 12(C) shows a relationship between the junction area and the magnetic resistance. When FIGS. 12(A) and 12(B) are compared with each other, it is found that the larger the junction area, the smaller the magnetic resistance ($\Delta R$) (in FIGS. 12($a$) and 12(B), the dotted lines and the solid lines correspond reverse polarities to each other). Also, as shown in FIG. 12(C), the larger the junction area, the smaller the resistance value. In short, as the junction area became larger, the rate of spin absorption was more increased, so that the spin accumulation voltage declined, resulting in the measured voltage becoming smaller. Thus, it is found that the spin absorption efficiency can be improved by increasing the junction area between the ferromagnetic dot and the non-ferromagnetic dot. In accordance with the present invention, since the ferromagnetic dot is three-dimensionally buried in the non-ferromagnetic dot so that the junction area therebetween becomes larger, it is found that the ferromagnetic dot can absorb a large quantity of spins.

EXPLANATION OF REFERENCES

10 Magnetization Reversal Device
11 Non-Ferromagnetic dot
12 Ferromagnetic dot
13a-13z Spin Injection Source
30 Memory Element
37 Insulating layer
40 Magnetic Field Generation Device
41 Tip End Portion
42a-42z Extension

The invention claimed is:

1. A magnetization reversal device comprising:
a ferromagnetic dot provided in an interconnection of a non-ferromagnetic dot so that a whole upper surface of said ferromagnetic dot, and a part or a whole of a side surface thereof, a whole lower surface thereof and a part or a whole of the side surface thereof, or a whole surface thereof is three-dimensionally buried in the interconnection of said non-ferromagnetic dot;
multi-terminal spin injection means that generates a spin-polarized pure spin current without a flow of charges, and that is provided in the interconnection of said non-ferromagnetic dot to be in contact therewith so that the interconnection of said non-ferromagnetic dot serves as a common electrode; and
an electric current source that supplies said spin injection means and said non-ferromagnetic dot with electric currents;
characterized by the facts that:
one of said multi-terminal spin injection means is provided at a position except for a current path for a corresponding pure spin current between another spin injection means of said multi-terminal spin injection means and said ferromagnetic dot;
a closed circuit is at least formed by said multi-terminal spin injection means, said non-ferromagnetic dot and said electric current source, wherein a diffusion current is generated by energizing said closed circuit with the electric currents; and said pure spin current flows into said ferromagnetic dot through the intermediary of the interconnection of said non-magnetic body due to said diffusion current by each of said multi-terminal spin injection means, to thereby reverse magnetization of said ferromagnetic dot.

2. A magnetization reversal device as set forth in claim 1, characterized by the fact:

that a relationship between a first injection direction in which a corresponding pure spin current is injected by a first spin injection means and a second injection direction in which a corresponding pure spin current is injected by a second spin injection means is one except for either a parallel relationship or an antiparallel relationship; and that a ratio of a quantity of the pure spin currents injected by said first spin injection means and said second spin injection means is adjusted in synchronization with a precession of the spins in said ferromagnetic dot so that a pure spin current featured by a vector having an optional direction in a two-dimensional plane is generated to a vector of the spins subjected to the precession in said ferromagnetic dot, whereby a torque acting on said spins is optimized.

3. A magnetization reversal device as set forth in claim 2, characterized by the fact:

that the device further comprises a third injection means for injecting a pure spin current;

that a relationship between a third injection direction in which a corresponding pure spin current is injected by said third spin injection means, said first injection direction and/or said second injection direction is one except for either a parallel relationship or an antiparallel relationship; and that a ratio of a quantity of the pure spin currents injected by said first spin injection means, said second spin injection means and said third spin injection means is adjusted in synchronization with a precession of the spins in said ferromagnetic dot so that a pure spin current featured by a vector having an optional direction is generated to a vector the spins subjected to the precession in said ferromagnetic dot, whereby a torque acting on said spins is optimized.

4. A magnetization reversal device as set forth in claim 1, characterized by the fact:

that a relationship between a first injection direction in which a corresponding pure spin current is injected by a first spin injection means and a second injection direction in which a corresponding pure spin current is injected by a second spin injection means is one except for either a parallel relationship or an antiparallel relationship; and that a ratio of a quantity of the pure spin currents injected by said first spin injection means and said second spin injection means is adjusted in synchronization with a precession of the spins in said ferromagnetic dot so that a pure spin current featured by a vector having an optional direction in a two-dimensional plane is generated to a vector of the spins subjected to the precession in said ferromagnetic dot, whereby a torque acting on said spins is optimized.

5. A magnetization reversal device as set forth in claim 4, characterized by the fact:

that the device further comprises a third injection means for injecting a pure spin current;

that a relationship between a third injection direction in which a corresponding pure spin current is injected by said third spin injection means, said first injection direction and/or said second injection direction is one except for either a parallel relationship or an antiparallel relationship; and that a ratio of a quantity of the pure spin currents injected by said first spin injection means, said second spin injection means and said third spin injection means is adjusted in synchronization with a precession of the spins in said ferromagnetic dot so that a pure spin current featured by a vector having an optional direction is generated to a vector the spins subjected to the precession in said ferromagnetic dot, whereby a torque acting on said spins is optimized.

6. A memory element using a magnetization reversal device as set forth in claim 1, characterized by the fact:

that the ferromagnetic dot is three-dimensionally provided at a position of any one point of intersection of a conductor non-ferromagnetic dot where horizontal lines and vertical lines are perpendicularly intersected with each other, in a state that a whole upper surface of said ferromagnetic dot, and a part or a whole of a side surface thereof, a whole lower surface thereof and a part or a whole of the side surface thereof, or a whole surface thereof is in contact with the interconnection of said non-ferromagnetic dot;

the spin injection means is provided at positions of any other ones of said points of intersection which are adjacent to said any one point of intersection at which said ferromagnetic dot is provided so that the spin injection means is in contact with the interconnection of said non-ferromagnetic dot so that the interconnection of said non-ferromagnetic dot serves as a common electrode; and magnetization of said ferromagnetic dot is reversed by the pure spin current from the spin injection means so that a bit is written therein.

7. A memory element as set forth in claim 6, characterized by the fact that the interconnection of said non-magnetic body of said conductor body has not only the vertically and horizontally intersected portion but also a perpendicularly and diagonally intersected portion.

8. A memory element as set forth in claim 6, characterized by the fact:

that at least a first spin injection means and a second spin injection means are provided at other points of intersection in the interconnection of said non-magnetic body, a relationship between a first injection direction in which a pure spin current is injected by said first spin injection means and a second injection direction in which a pure spin current is injected by said second spin injection means being one except for either a parallel relationship or an antiparallel relationship; and that a ratio of a quantity of the pure spin currents injected by said first spin injection means and said second spin injection means is adjusted in synchronization with a precession of the spins in said ferromagnetic dot so that a pure spin current having an optional direction in a two-dimensional plane is generated to the spins subjected to the precession in said ferromagnetic dot, whereby a torque acting on said spins is optimized.

9. A memory element as set forth in claim 8, characterized by the fact:

that the element further comprises a third injection means for injecting a pure spin current, which is provided at another point of intersection except for the points of intersection at which said first spin injection means and said second spin injection means are provided;

that a relationship between a third injection direction in which a corresponding pure spin current is injected by said third spin injection means, said first injection direction and/or said second injection direction is one except for either a parallel relationship or an antiparallel relationship; and that a ratio of a quantity of the pure spin currents injected by said first spin injection means, said second spin injection means and said third spin injection means is adjusted in synchronization with a precession of the spins in said ferromagnetic dot so that a pure spin current having an optional direction is generated to the spins subjected the precession in said ferromagnetic dot, whereby a torque acting on said spins is optimized.

10. A memory element using a magnetization reversal device as set forth in claim 1, characterized by the fact:

that the ferromagnetic dot is provided in a tip end portion of an interconnection composed of a non-ferromagnetic dot, in a state that a whole upper surface of said ferromagnetic dot, and a part or a whole of a side surface thereof, a whole lower surface thereof and a part or a whole of the side surface thereof, or a whole surface thereof is in contact with the interconnection of said non-ferromagnetic dot;

the spin injection means is provided so that at least one part of said spin injection means is in contact with plural extensions extended rearward away from the tip end portion of the interconnection of said non-ferromagnetic dot; and that a magnetic field is generated from said ferromagnetic dot by the pure spin current from the spin injection means.

11. A magnetic field generation device as set forth in claim 10, characterized by the fact:

that said extensions are radially extended from away from said tip end portion, and are arranged at angular intervals in magnetic field generation directions of said ferromagnetic dot.

12. A magnetic field generation device as set forth in claim 11, characterized by the fact that said extension is formed into a V-shaped one having two extension portions.

13. A magnetic field generation device as set forth in claim 10, characterized by the fact:

that the device comprises plural extensions;

that at least a first spin injection means and a second spin injection means are provided in said extensions, a relationship between a first injection direction in which a pure spin current is injected by said first spin injection means and a second injection direction in which a pure spin current is injected by said second spin injection means being one except for either a parallel relationship or an antiparallel relationship; and that a ratio of a quantity of the pure spin currents injected by said first spin injection means and said second spin injection means is adjusted in synchronization with a precession of the spins in said ferromagnetic dot so that a pure spin current featured by a vector having an optional direction in a two-dimensional plane is generated to the spins subjected the precession in said ferromagnetic dot, whereby a torque acting on said spins is optimized.

14. A magnetic field generation device as set forth in claim 13, characterized by the fact:

that the element further comprises a third injection means for injecting a pure spin current, which is provided at another an extension except for the extensions in which said first spin injection means and said second spin injection means are provided;

that a relationship between a third injection direction in which a corresponding pure spin current is injected by said third spin injection means, said first injection direction and/or said second injection direction is one except for either a parallel relationship or an antiparallel relationship; and that a ratio of a quantity of the pure spin currents injected by said first spin injection means, said second spin injection means and said third spin injection means is adjusted in synchronization with a precession of the spins in said ferromagnetic dot so that a pure spin current featured by a vector having an optional direction is generated to the spins subjected the precession in said ferromagnetic dot, whereby a torque acting on said spins is optimized.

* * * * *